(12) United States Patent
Ishida et al.

(10) Patent No.: US 11,374,043 B2
(45) Date of Patent: Jun. 28, 2022

(54) PHOTODETECTION DEVICE WITH MATRIX ARRAY OF AVALANCHE DIODES

(71) Applicant: HAMAMATSU PHOTONICS K.K., Hamamatsu (JP)

(72) Inventors: Atsushi Ishida, Hamamatsu (JP); Terumasa Nagano, Hamamatsu (JP); Takashi Baba, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 481 days.

(21) Appl. No.: 16/316,652

(22) PCT Filed: Jul. 26, 2017

(86) PCT No.: PCT/JP2017/027055
§ 371 (c)(1),
(2) Date: Jan. 10, 2019

(87) PCT Pub. No.: WO2018/021411
PCT Pub. Date: Feb. 1, 2018

(65) Prior Publication Data
US 2021/0134862 A1    May 6, 2021

(30) Foreign Application Priority Data

Jul. 27, 2016  (JP) .............................. JP2016-147380

(51) Int. Cl.
*H01L 27/146*   (2006.01)
*H01L 31/107*   (2006.01)

(52) U.S. Cl.
CPC .. *H01L 27/14607* (2013.01); *H01L 27/14636* (2013.01); *H01L 27/14643* (2013.01); *H01L 31/107* (2013.01)

(58) Field of Classification Search
CPC ......... H01L 27/14607; H01L 27/14636; H01L 27/14643; H01L 31/107
(Continued)

(56) References Cited

U.S. PATENT DOCUMENTS

2004/0245592 A1\* 12/2004 Harmon .................... G01J 1/44
                                                           257/438
2006/0124832 A1\*  6/2006 Harmon et al. ...... H01L 27/146
                                                           250/214 R
(Continued)

FOREIGN PATENT DOCUMENTS

CN        103515402 A     1/2014
CN        103890972 A     6/2014
(Continued)

OTHER PUBLICATIONS

International Preliminary Report on Patentability dated Feb. 7, 2019 for PCT/JP2017/027055.

*Primary Examiner* — Allen L Parker
*Assistant Examiner* — Wasiul Haider
(74) *Attorney, Agent, or Firm* — Faegre Drinker Biddle & Reath LLP

(57) ABSTRACT

A photodetecting device includes a semiconductor substrate, a plurality of avalanche photodiodes each having a light receiving region, the avalanche photodiodes being arranged in a matrix at the semiconductor substrate, and a plurality of through-electrodes electrically connected to corresponding light receiving regions. The plurality of through-electrodes are arranged for each area surrounded by four mutually adjacent avalanche photodiodes of the plurality of avalanche photodiodes. Each of the light receiving regions has, when viewed from a direction perpendicular to a first principal surface of the semiconductor substrate, a polygonal shape including a pair of first sides opposing each other in a row direction and extending in a column direction and four (Continued)

second side opposing four through-electrodes surrounding the light receiving region and extending in directions intersecting with the row direction and the column direction. The length of the first side is shorter than the length of the second side.

9 Claims, 12 Drawing Sheets

(58) Field of Classification Search
 USPC .......................................................... 257/438
 See application file for complete search history.

(56) References Cited

U.S. PATENT DOCUMENTS

| | | | |
|---|---|---|---|
| 2006/0175529 A1* | 8/2006 | Harmon | H01L 31/035236 250/207 |
| 2010/0108893 A1* | 5/2010 | Flitsch et al. | H01L 27/1464 257/443 |
| 2011/0227134 A1* | 9/2011 | Innocent | H01L 27/14607 257/225 |
| 2011/0241149 A1* | 10/2011 | Mazzillo | H01L 31/107 257/438 |
| 2011/0272561 A1* | 11/2011 | Sanfilippo | H01L 31/107 250/214.1 |
| 2013/0341694 A1 | 12/2013 | Maekawa et al. | |
| 2014/0077186 A1* | 3/2014 | Kim | H01L 27/3218 257/40 |
| 2014/0252524 A1* | 9/2014 | Sanfilippo | H01L 31/107 257/432 |
| 2014/0263975 A1* | 9/2014 | Nagano | G01T 1/208 250/208.2 |
| 2014/0291486 A1* | 10/2014 | Nagano | H01L 27/14658 250/208.2 |
| 2015/0054111 A1* | 2/2015 | Niclass | H01L 31/107 257/438 |
| 2015/0069566 A1* | 3/2015 | Tagami | H01L 31/022408 257/458 |
| 2015/0138388 A1 | 5/2015 | Endo et al. | |
| 2016/0211289 A1 | 7/2016 | Miyanami | |
| 2017/0031010 A1* | 2/2017 | Suzuki | G01S 17/42 |
| 2018/0294305 A1* | 10/2018 | Janssens | H01L 27/1463 |

FOREIGN PATENT DOCUMENTS

| | | | | |
|---|---|---|---|---|
| CN | 104737304 A | | 6/2015 | |
| CN | 105009289 A | | 10/2015 | |
| EP | 2960939 A1 | | 12/2015 | |
| JP | 2010-153603 A | | 7/2010 | |
| JP | 2010153603 A | * | 7/2010 | ........... H01L 27/148 |
| JP | 2015-61041 A | | 3/2015 | |
| JP | 2016-29738 A | | 3/2016 | |
| WO | WO-2008/004547 A1 | | 1/2008 | |
| WO | WO-2013058001 A | * | 4/2013 | ....... H01L 27/14643 |

* cited by examiner

PHOTODETECTION DEVICE WITH MATRIX ARRAY OF AVALANCHE DIODES

TECHNICAL FIELD

The present invention relates to a photodetecting device.

BACKGROUND ART

Known photodetecting devices include a semiconductor substrate including a first principal surface and a second principal surface that oppose each other (see, for example, Patent Literature 1). The photodetecting device described in Patent Literature 1 includes a plurality of avalanche photodiodes operating in Geiger mode and through-electrodes electrically connected to the corresponding avalanche photodiodes. The plurality of avalanche photodiodes are two-dimensionally arranged on the semiconductor substrate. Each avalanche photodiode includes a light receiving region disposed at the first principal surface side of the semiconductor substrate. The through-electrode penetrates through the semiconductor substrate in the thickness direction.

CITATION LIST

Patent Literature

Patent Literature 1: Japanese Unexamined Patent Publication No. 2015-61041

SUMMARY OF INVENTION

Technical Problem

The object of an aspect of the present invention is to provide a photodetecting device in which the aperture ratio is ensured, and the occurrence of crosstalk between avalanche photodiodes is suppressed.

Solution to Problem

As a result of researches and studies, the present inventors have newly found the following facts.

When a photodetecting device includes a plurality of avalanche photodiodes, a through-electrode is placed in a first area surrounded by the adjacent avalanche photodiodes, for example, in order to shorten the wiring distance from the avalanche photodiode. When the through-electrode is disposed in a second area away from the avalanche photodiode, the wiring distance between the avalanche photodiode and the through-electrode is large, and the difference in the wiring distances between the avalanche photodiodes is large, as compared with when the through-electrode is disposed in the first area. The wiring distance is related to the wiring resistance, the parasitic capacitance, and the like, and affects the detection accuracy of the photodetecting device.

The through-electrode becomes a dead space for photodetection. Therefore, when the through-electrode is disposed in the first area, an effective area for photodetection is small, as compared with when the through-electrode is disposed in the second area. That is, when the through-electrode is arranged in the first area, the aperture ratio may decrease. When the aperture ratio decreases, photodetection characteristics of the photodetecting device are deteriorated.

In order to suppress the reduction of the aperture ratio, it is desirable that the dead space is as small as possible. For example, when the distance (pitch) between the avalanche photodiodes is small, the aperture ratio is ensured, as compared with when the distance between the avalanche photodiodes is large. However, when the distance between the avalanche photodiodes is small, the detection accuracy of the photodetecting device may be deteriorated because of the crosstalk between adjacent avalanche photodiodes, as compared with when the distance between multiple avalanche photodiodes is large. For example, in the Geiger mode-type avalanche photodiode, light emission may occur due to avalanche multiplication, and therefore, the avalanche photodiode may receive the light emitted by an adjacent avalanche photodiode. Therefore, the photodetecting device may output a detection result affected by the emission of the avalanche photodiode itself.

Therefore, the present inventors keenly studied a configuration in which the aperture ratio is ensured, and the occurrence of crosstalk between avalanche photodiodes is suppressed.

The present inventors found the following configuration. A light receiving region of each of a plurality of avalanche photodiodes arranged in a matrix has a polygonal shape including a pair of first sides and four second sides when viewed from a direction perpendicular to the first principal surface. The pair of first sides oppose each other in a row direction and are extending in a column direction. The four second sides oppose four through-electrodes surrounding the light receiving region and are extending in directions intersecting with the row direction and the column direction. The length of the first side is shorter than the length of the second side. In the above configuration, the first sides of the light receiving regions of two avalanche photodiodes adjacent in the row direction oppose each other in the row direction. When the length of the first side is short, the area where crosstalk occurs in the avalanche photodiodes adjacent to each other in the row direction is small, as compared with when the length of the first side is long. Therefore, in the above configuration, the length of the first side is shorter than the length of the second side, and therefore, the crosstalk between avalanche photodiodes adjacent to each other in the row direction is suppressed, as compared with in a configuration in which the length of the first side is equal to or more than the length of the second side.

An aspect of the present invention is a photodetecting device including a semiconductor substrate including a first principal surface and a second principal surface that oppose each other, a plurality of avalanche photodiodes operating in Geiger mode, and a plurality of through-electrodes. Each of the plurality of avalanche photodiodes includes a light receiving region disposed at the first principal surface side of the semiconductor substrate, and the avalanche photodiodes are arranged in a matrix at the semiconductor substrate. The plurality of through-electrodes are electrically connected to corresponding light receiving regions, and are penetrating through the semiconductor substrate in a thickness direction. The plurality of through-electrodes are arranged for each area surrounded by four mutually adjacent avalanche photodiodes of the plurality of avalanche photodiodes. Each of the light receiving regions has, when viewed from a direction perpendicular to the first principal surface, a polygonal shape including a pair of first sides and four second sides. The pair of first sides oppose each other in a row direction and extending in a column direction. The four second sides oppose four through-electrodes surrounding the light receiving region and extending in directions intersecting with the row direction and the column direction. The length of the first side is shorter than the length of the second side.

In the photodetecting device according to the aspect, each length of the first side is shorter than the length of the second side, and therefore, the aperture ratio is ensured, and the crosstalk between adjacent avalanche photodiodes is suppressed.

In the photodetecting device according to the aspect, a polygonal shape of each of the light receiving regions may further include a pair of third sides opposing each other in the column direction and extending in the row direction. In which case, a length of the third side is shorter than the length of the second side. In this embodiment, the polygonal shape of each of the light receiving regions includes the pair of third sides, and therefore, the third sides of the light receiving regions of the two avalanche photodiodes adjacent to each other in the column direction oppose each other in the column direction. When the length of the third side is short, the area where the crosstalk occurs between the avalanche photodiodes adjacent to each other in the column direction is small, as compared with when the length of the third side is long. Therefore, in this embodiment, the length of the third side is shorter than the length of the second side, and therefore, the crosstalk between the avalanche photodiodes adjacent to each other in the column direction is suppressed. In this embodiment, the aperture ratio is ensured, and the crosstalk between avalanche photodiodes adjacent to each other in the column direction is suppressed.

In the photodetecting device according to the aspect, a total length of the four second sides may be equal to or more than 50% of an entire circumference of the light receiving region. In which case, the total length of the sides defining the area between adjacent avalanche photodiodes is less than half of the entire circumference of the light receiving region. Therefore, in this embodiment, the aperture ratio is ensured, and the crosstalk between avalanche photodiodes is suppressed more greatly.

In the photodetecting device according to the aspect, when viewed from a direction perpendicular to the first principal surface, a groove may be formed at the first principal surface side of the semiconductor substrate to surround the light receiving region. In which case, the groove optically divides the light receiving region from other areas, and therefore, the crosstalk between adjacent avalanche photodiodes is suppressed more greatly.

In the photodetecting device according to the aspect, when viewed from a direction perpendicular to the first principal surface, the groove may surround the entire circumference of the corresponding light receiving region. In which case, the groove is also formed in the area between the light receiving region and the through-electrode adjacent to the light receiving region. Therefore, in this embodiment, the aperture ratio is ensured, and an inflow of a surface leakage electric current to the avalanche photodiode is reduced. In this embodiment, the groove further reduces the crosstalk between the avalanche photodiodes.

In the photodetecting device according to the aspect, the groove formed to surround two light receiving regions adjacent to each other in the row direction may share a portion formed between the two light receiving regions adjacent to each other in the row direction. In which case, the groove allows the light receiving regions to be arranged densely in the row direction, as compared with when the portion formed between the two light receiving regions is not shared. When the plurality of light receiving regions are densely arranged, the aperture ratio is further improved.

In the photodetecting device according to the aspect, the groove formed to surround two light receiving regions adjacent to each other in the column direction may share a portion formed between the two light receiving regions adjacent to each other in the column direction. In which case, the groove allows the light receiving regions to be arranged densely in the column direction, as compared with when the portion formed between the two light receiving regions is not shared. When the plurality of light receiving regions are densely arranged, the aperture ratio is further improved.

In the photodetecting device according to the aspect, when viewed from a direction perpendicular to the first principal surface, the area surrounded by the groove may have a polygonal shape. When the area surrounded by the groove and the light receiving region are in polygonal shapes, it is possible to employ a configuration in which the area surrounded by the groove and the light receiving region are arranged in such a manner that a side of the area surrounded by the groove is along a side of the light receiving region. The photodetecting device employing this configuration has a small dead space, and a high aperture ratio.

In the photodetecting device according to the aspect, the through-electrode is arranged in a through-hole penetrating through the semiconductor substrate in the thickness direction. In which case, when viewed from a direction perpendicular to the first principal surface, an opening of the through-hole may have a circular shape. An insulating layer may be arranged in an inner peripheral surface of the through-hole. When the insulating layer is arranged on the inner peripheral surface of the through-hole, the through-electrode and the semiconductor substrate are electrically insulated from each other. When there is a corner at the opening of the through-hole, a crack may be formed at the corner of the insulating layer when the insulating layer is formed. When the through-hole has a circular shape when viewed from the direction perpendicular to the first principal surface, a crack is unlikely to be generated in the insulating layer when the insulating layer is formed. Therefore, in this embodiment, electrical insulation between the through-electrode and the semiconductor substrate is ensured.

Advantageous Effects of Invention

An aspect of the present invention provides a photodetecting device in which the aperture ratio is ensured, and the occurrence of crosstalk between avalanche photodiodes is suppressed.

DESCRIPTION OF EMBODIMENTS

Figure 1:
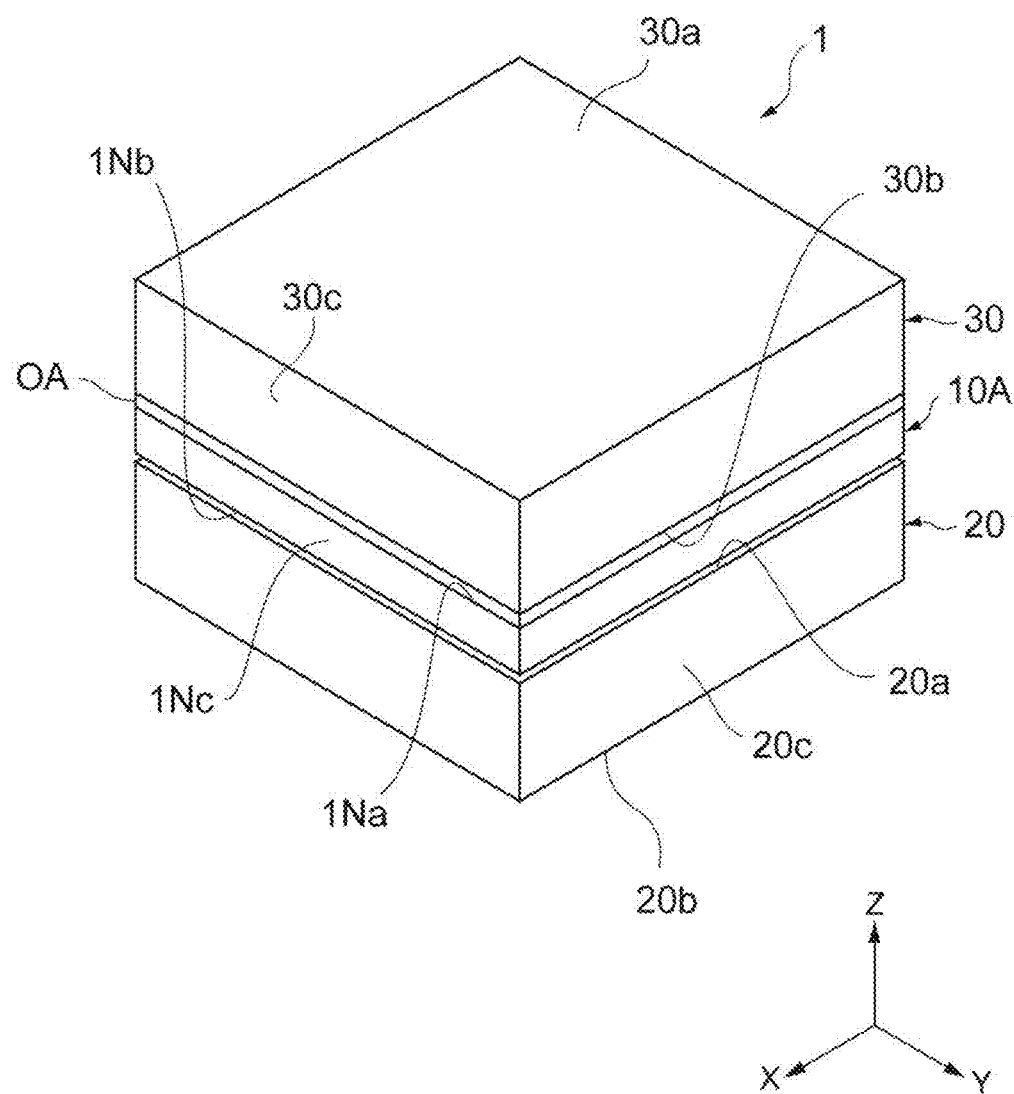
FIG. 1 is a schematic perspective view illustrating a photodetecting device according to an embodiment.

Embodiments of the present invention will be hereinafter described in detail with reference to the accompanying drawings. In the description, the same reference numerals are used for the same elements or elements having the same functions, and redundant descriptions thereabout are omitted.

Figure 2:
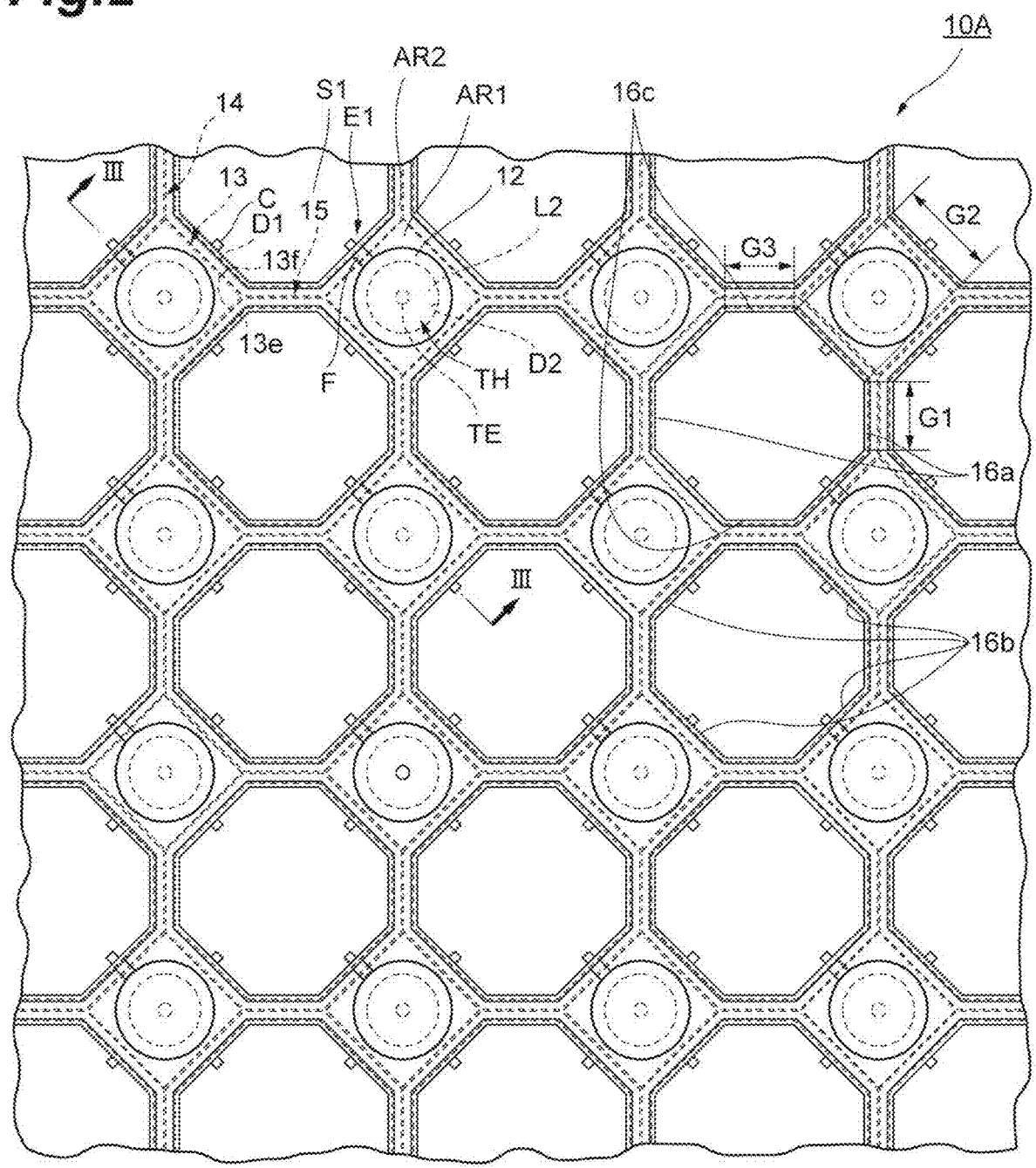
FIG. 2 is a schematic plan view illustrating a semiconductor photodetecting element.
Figure 2:
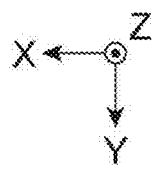
Figure 3:
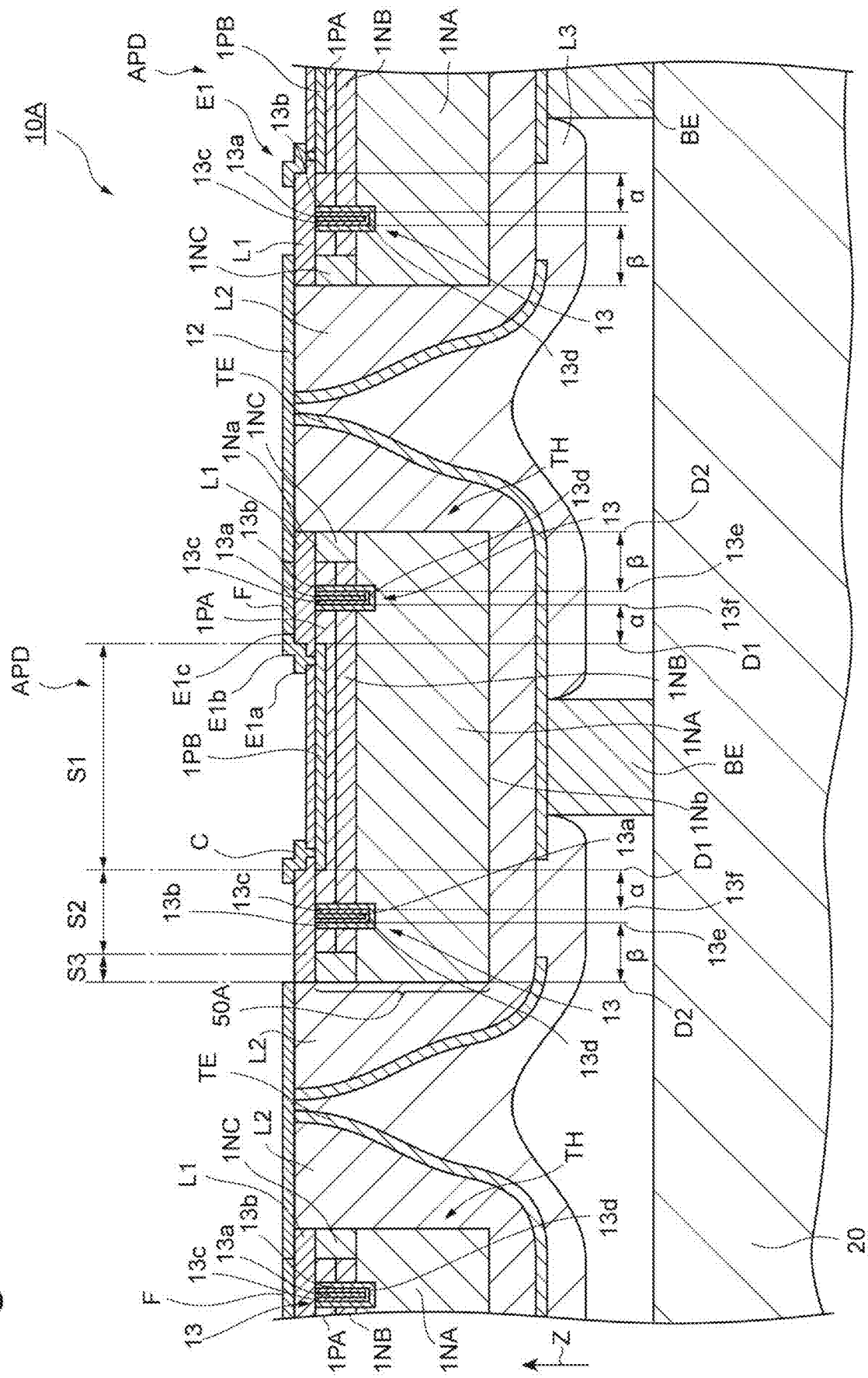
FIG. 3 is a diagram for describing a cross-sectional configuration along line III-III illustrated in FIG. 2.
Figure 12:
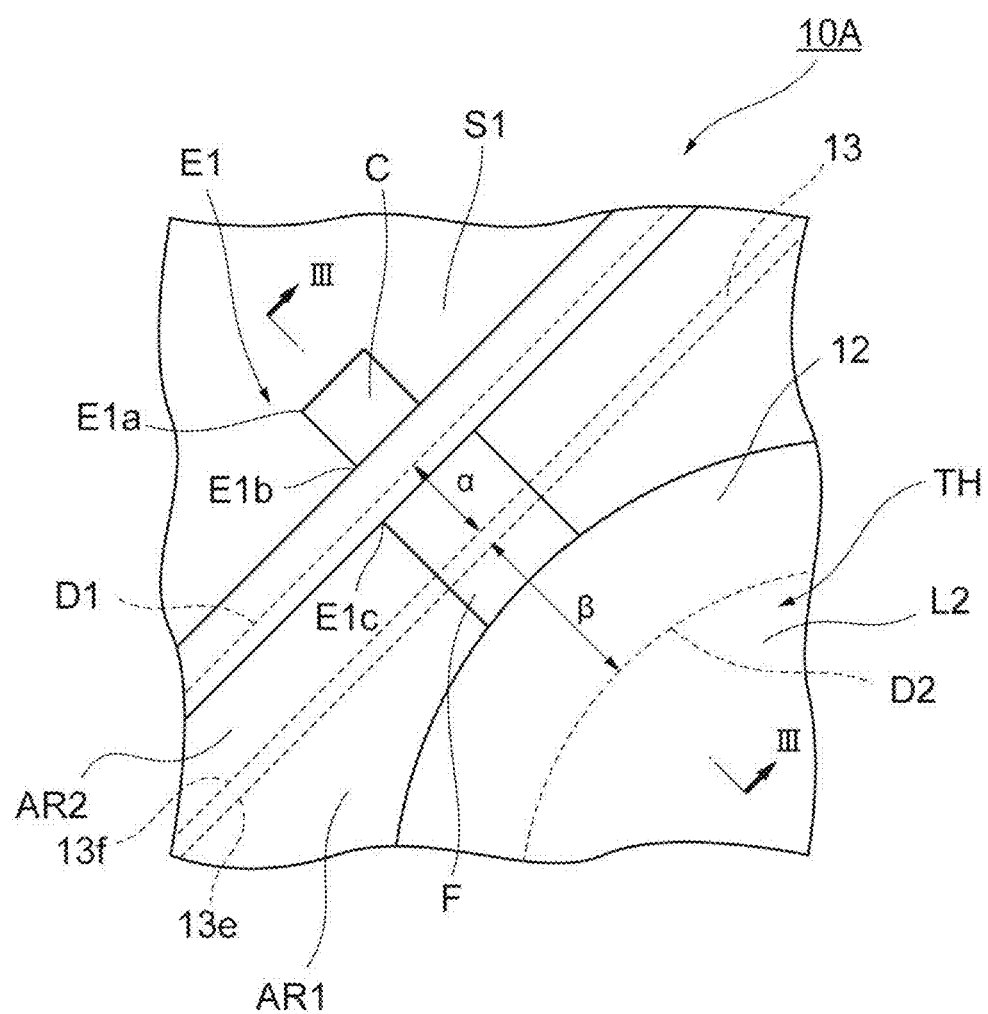
FIG. 12 is a schematic enlarged view illustrating the semiconductor photodetecting element.

First, a configuration of a photodetecting device 1 according to the present embodiment will be described with reference to FIG. 1 to FIG. 3 and FIG. 12. FIG. 1 is a schematic perspective view illustrating a photodetecting device according to the present embodiment. FIG. 2 is a schematic plan view illustrating a semiconductor photodetecting element. FIG. 3 is a diagram for describing a cross-sectional configuration along line III-III as illustrated in FIG. 2. FIG. 12 is a schematic enlarged view illustrating the semiconductor photodetecting element.

As illustrated in FIG. 1, the photodetecting device 1 includes a semiconductor photodetecting element 10A, a mounting substrate 20, and a glass substrate 30. The mounting substrate 20 opposes the semiconductor photodetecting element 10A. The glass substrate 30 opposes the semiconductor photodetecting element 10A. The semiconductor photodetecting element 10A is disposed between the mounting substrate 20 and the glass substrate 30. In the present embodiment, a plane in parallel with each principal surface of the semiconductor photodetecting element 10A, the mounting substrate 20, and the glass substrate 30 is the XY-axis plane, and a direction perpendicular to each principal surface is the Z-axis direction.

The semiconductor photodetecting element 10A includes a semiconductor substrate 50A having a rectangular shape in a plan view. The semiconductor substrate 50A is made of Si and is an N type (second conductivity type) semiconductor substrate. The semiconductor substrate 50A includes a principal surface 1Na and a principal surface 1Nb that oppose each other.

As illustrated in FIG. 2, the semiconductor photodetecting element 10A includes a plurality of avalanche photodiodes APD and a plurality of through-electrodes TE. The plurality of avalanche photodiodes APD are two-dimensionally arranged on the semiconductor substrate 50A. In the present embodiment, the avalanche photodiodes APD are arranged in a matrix. In the present embodiment, the row direction is X-axis direction and the column direction is Y-axis direction. The avalanche photodiodes APD are arranged with an equal distance on a straight line when the avalanche photodiodes APD are viewed from each of the X-axis direction and the Y-axis direction.

Figure 6:
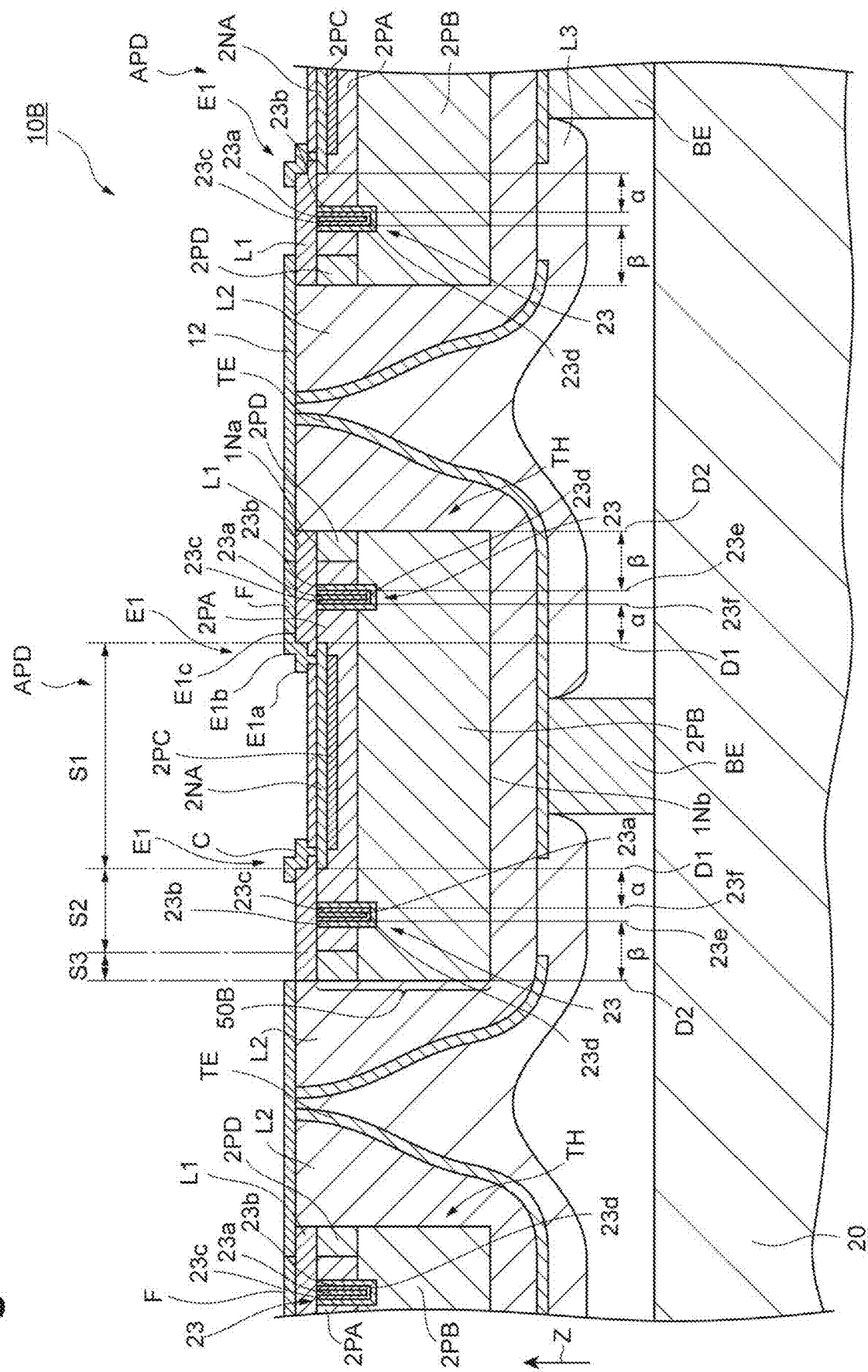
FIG. 6 is a diagram for describing a cross-sectional configuration of a photodetecting device according to a modification of the present embodiment.

Each avalanche photodiode APD includes a light receiving region S1 and operates in Geiger mode. The light receiving region S1 is arranged at a principal surface 1Na side of the semiconductor substrate 50A. As illustrated in FIG. 6, the avalanche photodiodes APD are connected in parallel in such a manner that a quenching resistor R1 is connected in series with each avalanche photodiode APD. A reverse bias voltage is applied to each avalanche photodiode APD from a power supply. The output electric current from each avalanche photodiode APD is detected by a signal processing unit SP. The light receiving region S1 is a charge generating region (a photosensitive region) configured to generate charges in response to incident light. That is, the light receiving region S1 is a photodetecting region.

The glass substrate 30 includes a principal surface 30a and a principal surface 30b that oppose each other. The glass substrate 30 has a rectangular shape in a plan view. The principal surface 30b opposes the principal surface 1Na of the semiconductor substrate 50A. The principal surface 30a and the principal surface 30b are flat. The glass substrate 30 and the semiconductor photodetecting element 10A are optically connected by an optical adhesive OA. The glass substrate 30 may be formed directly on the semiconductor photodetecting element 10A.

A scintillator (not illustrated) may be optically connected to the principal surface 30a of the glass substrate 30. In which case, the scintillator is connected to the principal surface 30a by an optical adhesive. The scintillation light from the scintillator passes through the glass substrate 30 and is incident on the semiconductor photodetecting element 10A.

The mounting substrate 20 includes a principal surface 20a and a principal surface 20b that oppose each other. The mounting substrate 20 has a rectangular shape in a plan view. The principal surface 20a opposes the principal surface 1Nb of the semiconductor substrate 50A. The mounting substrate 20 includes a plurality of electrodes arranged on the principal surface 20a. These electrodes are arranged corresponding to the through-electrodes TE.

The side surface 1Nc of the semiconductor substrate 50A, the side surface 30c of the glass substrate 30, and the side surface 20c of the mounting substrate 20 are flush with each other. That is, in the plan view, the outer edge of the semiconductor substrate 50A, the outer edge of the glass substrate 30, and the outer edge of the mounting substrate 20 match each other. The outer edge of the semiconductor substrate 50A, the outer edge of the glass substrate 30, and the outer edge of the mounting substrate 20 do not have to match each other. For example, in the plan view, the area of the mounting substrate 20 may be larger than the area of each of the semiconductor substrate 50A and the glass substrate 30. In which case, the side surface 20c of the mounting substrate 20 is located outside, in the XY-axis plane direction, of the side surface 1Nc of the semiconductor substrate 50A and the side surface 30c of the glass substrate 30.

Next, the structure of the semiconductor photodetecting element 10A will be described with reference to FIG. 2 and FIG. 12. FIG. 2 is a view illustrating the semiconductor photodetecting element 10A that is viewed from the direction perpendicular to the principal surface 1Na of the semiconductor substrate 50A (Z-axis direction). FIG. 12 illustrates an area where the groove is formed.

One avalanche photodiode APD constitutes one cell in the semiconductor photodetecting element 10A. Each avalanche photodiode APD includes one light receiving region S1. That is, the semiconductor photodetecting element 10A includes a plurality of light receiving regions S1. The light receiving region S1 has a polygonal shape when viewed from the Z-axis direction. The light receiving region S1 of the semiconductor photodetecting element 10A has an octagonal shape when viewed from the Z-axis direction.

The plurality of light receiving regions S1 are two-dimensionally arranged when viewed from the Z-axis direction. In the present embodiment, the plurality of light receiving regions S1 are arranged in a matrix. The light receiving regions S1 are arranged with an equal distance on a straight line when viewed from each of the X-axis direction and the Y-axis direction. In the present embodiment, the light receiving regions S1 are arranged with a pitch of 100 μm. In the semiconductor photodetecting element 10A, two adjacent light receiving regions S1 are arranged in such a manner that one side of an octagon shape opposes each other.

Each avalanche photodiode APD includes an electrode E1 The electrode E1 is arranged on the principal surface 1Na side of the semiconductor substrate 50A. The electrode E1 is provided along the contour of the light receiving region S1 and has an octagonal ring shape.

The electrode E1 includes a connected portion C that is electrically connected to the light receiving region S1. The connected portions C are provided on the four sides of the light receiving region S1. The connected portions C are provided alternately on the sides of the light receiving region S1. In which case, the detection accuracy of the signal from the light receiving region S1 is ensured. As illustrated in FIG. 12, the connected portion C includes a first end portion E1a and a second end portion E1b and extends on the XY-axis plane from the outer edge toward the center of the light receiving region S1. As also illustrated in FIG. 3, the electrode E1 extends in the Z-axis direction at the second end portion E1b. Accordingly, a step is formed at the position of the second end portion E1b in the electrode E1. The electrode E1 extends from the step in the direction opposite to the center of the light receiving region S1. The electrode E1 includes a third end portion E1c that is electrically connected to the wiring F.

As illustrated also in FIG. 3, the wiring F extends from the third end portion E1c in the direction opposite to the center of the light receiving region S1. The wiring F electrically connects the electrode E1 and an electrode pad 12. The wiring F is located above the semiconductor substrate 50A outside of the light receiving region S1. The wiring F is formed above the semiconductor substrate 50A with an insulating layer L1 interposed therebetween.

The electrode E1 and a through-electrode TE are made of metal. The electrode E1 and the through-electrode TE are made of, for example, aluminum (Al). When the semiconductor substrate is made of Si, copper (Cu) is used as an electrode material instead of aluminum. The electrode E1 and the through-electrode TE may be integrally formed. The electrode E1 and the through-electrode TE are formed, for example, by sputtering.

The semiconductor photodetecting element 10A includes a plurality of the through-electrodes TE and a plurality of the electrode pads 12. Each through-electrode TE is electrically connected to a corresponding avalanche photodiode APD. Each electrode pad 12 is electrically connected to a corresponding through-electrode TE. The electrode pad 12 is electrically connected to the electrode E1 through the wiring F. The electrode pad 12 is arranged on the principal surface 1Na. Each through-electrode TE is electrically connected to the light receiving region S1 through the electrode pad 12, the wiring F, and the electrode E1. The electrode pad 12 is positioned in an area (the inner area of the groove 13) AR1 surrounded by the groove 13 when viewed from the Z-axis direction, and the electrode pad 12 is away from the groove 13.

The through-electrode TE is disposed in the through-hole TH penetrating through the semiconductor substrate 50A in the thickness direction (Z-axis direction). In the semiconductor substrate 50A, a plurality of through-holes TH are formed. The plurality of through-holes TH are arranged in an area where the plurality of avalanche photodiodes APD are arranged two-dimensionally. The plurality of through-holes TH are formed in each area surrounded by four mutually adjacent avalanche photodiodes APD of the plurality of avalanche photodiodes APD.

The opening of the through-hole TH is located in the XY-axis plane and has a circular shape when viewed from the Z-axis direction. The cross-sectional shape of the through-hole TH in the cross section in parallel with the XY-axis plane is a circular shape. The semiconductor photodetecting element 10A includes the insulating layer L2 on the inner peripheral surface of the through-hole TH. The through-electrode TE is arranged in the through-hole TH with the insulating layer L2 interposed therebetween.

The plurality of through-holes TH are arranged in such a manner that the centers of the openings are located in a matrix when viewed from the Z-axis direction. In the present embodiment, the row direction is X-axis direction and the column direction is Y-axis direction. The plurality of through-holes TH are arranged in such a manner that the centers of the openings are arranged with an equal distance on a straight line when viewed from each of the X-axis direction and the Y-axis direction. The through-holes TH are arranged with a pitch of 100 μm.

The plurality of through-electrodes TE penetrate through the semiconductor substrate 50A side from the principal surface 1Na to the principal surface 1Nb side. The through-electrode TE is disposed for each through-hole TH. The plurality of through-electrodes TE are formed in each area surrounded by four mutually adjacent avalanche photodiodes APD of the plurality of avalanche photodiodes APD. The plurality of through-electrodes TE penetrate through the semiconductor substrate 50A in the thickness direction. The through-electrode TE is disposed for each avalanche photodiode APD. The through-electrode TE is electrically connected to a corresponding light receiving region S1. The through-electrode TE is electrically connected to the light receiving region S1 of one of the four avalanche photodiodes APD surrounding the arranged through-hole TH.

The plurality of through-holes TH and the plurality of light receiving regions S1 are arranged in such a manner that, when viewed from the Z-axis direction, four through-holes TH surround one light receiving region S1 and four light receiving regions S1 surround one through-hole TH. The through-hole TH and the light receiving region S1 are alternately arranged in directions crossing the X-axis and the Y-axis.

When viewed from the Z-axis direction, a polygonal shape of each light receiving region S1 includes a pair of first sides 16a, four second sides 16b, and a pair of third sides 16c. The pair of first sides 16a oppose each other in the row direction and extend in the column direction. The first sides 16a of the light receiving regions S1 of two mutually adjacent avalanche photodiodes APD in the row direction oppose each other in the row direction. The four second sides 16b oppose the four through-electrodes TE surrounding the light receiving region S1 and extend in a direction intersecting with the row direction and the column direction (i.e. the four second sides 16b each extend at an oblique angle to both the row direction and the column direction). The directions in which the second sides 16b extend are different. The pair of third sides 16c oppose each other in the column direction and extend in the row direction. The third sides 16c of the light receiving regions S1 of the two avalanche photodiodes APD adjacent to each other in the column direction oppose each other in the column direction.

The four first sides 16a and the four third sides 16c, of the sides of the octagonal shape of the light receiving region S1, oppose the sides of the adjacent light receiving region S1. The four second sides 16b face the through-holes TH located next to the light receiving region S1. Any given through-hole TH is surrounded by the second sides 16b of the four light receiving regions S1 in four directions.

The connected portions C are provided to the four second sides 16b opposing the through-hole TH. A length G1 of the first side 16a is shorter than a length G2 of the second side 16b. A length G3 of the third side 16c is shorter than the length G2 of the second side 16b. The total length of the four second sides 16b is 50% or more of the entire circumference of the light receiving region S1. In the present embodiment, the length G1 of each of the first sides 16a is shorter than the length G2 of each of the second sides 16b. Furthermore, the length G3 of each of the third sides 16c is shorter than the length G2 of each of the second sides 16b. Each of the first sides 16a may have substantially the same length. Each of the second sides 16b may have substantially the same length. Each of the third sides 16c may have substantially the same length.

The principal surface 1Na of the semiconductor substrate 50A includes the light receiving region S1, an intermediate area S2, and an opening peripheral area S3. The opening peripheral area S3 is an area located at the peripheral of the opening of the through-hole TH of the principal surface 1Na. The intermediate area S2 is an area excluding the light receiving region S1 and the opening peripheral area S3 in the principal surface 1Na.

Grooves 13, 14, 15 surrounding the entire circumference of each light receiving region S1 are formed in the intermediate area S2 of the semiconductor substrate 50A. When viewed from the Z-axis direction, the groove 13 is formed in the intermediate area S2 between the light receiving regions S1 of each of the four mutually adjacent avalanche photodiodes APD and the through-hole TH surrounded by these avalanche photodiodes APD. The groove 13 extends along the second side 16b of each light receiving region S1 when viewed from the Z-axis direction. The grooves 14 and 15 are formed in the intermediate area S2 between the two mutually adjacent light receiving regions S1. The groove 14 extends along the first side 16a of each light receiving region S1. The groove 15 extends along the third side 16c of each light receiving region S1. The grooves 13, 14, and 15 extend along the sides of the light receiving regions S1, and surround the entire circumference of each light receiving region S1.

The entire circumference of the through-hole TH surrounded by the four mutually adjacent avalanche photodiodes APD is surrounded by the grooves 13 when viewed from the Z-axis direction. The groove 13 extends along the second sides 16b of the light receiving regions S1 of the above four avalanche photodiodes APD. The grooves 14 and 15 connect the grooves 13 surrounding different through-holes TH when viewed from the Z-axis direction.

The area AR1 surrounded by the groove 13 is substantially square when viewed from the Z-axis direction. In a single given area AR1, a single through-hole TH is provided. The area AR2 surrounded by the grooves 13, 14, and 15 has an octagonal shape. In a single area AR2, a single light receiving region S1 is provided. Each area AR1 and AR2 has a polygonal shape when viewed from the Z-axis direction.

The groove 14 extending along the first side 16a of each light receiving region S1 is located on one straight line in the area between two adjacent light receiving regions S1. The groove 14 is shared by two adjacent light receiving regions S1. The groove 14 is not only a groove surrounding one light receiving region S1 at one side but also a groove surrounding the light receiving region S1 at the other side. The groove 15 extending along the third side 16c of each light receiving region S1 is located on one straight line in the area between two adjacent light receiving regions S1. The groove 15 is shared by two adjacent light receiving regions S1. The groove 15 is not only a groove surrounding the light receiving region S1 at one side but also a groove surrounding the light receiving region S1 at the other side. The groove 14 surrounding the two light receiving regions S1 adjacent to each other in the row direction shares a portion formed between two light receiving regions S1 adjacent to each other in the row direction. The groove 15 surrounding two light receiving regions S1 adjacent to each other in the column direction shares a portion formed between two adjacent light receiving regions in the column direction.

As illustrated in FIG. 12, a distance β from an edge 13e of the groove 13 to an edge D2 of the through-hole TH surrounded by the groove 13 is longer than a distance α from an edge 13f of the groove 13 to an edge D1 of the light receiving region S1 adjacent to the through-hole TH. In the present embodiment, the distance α is 5.5 μm and the distance β is 7.5 μm. The distance α and the distance β are the shortest distances when viewed from the Z-axis direction. The distance α is the shortest distance from the edge 13f of the groove 13 to the edge D1 of the light receiving region S1 adjacent to the through-hole TH when viewed from the Z-axis direction. The distance β is the shortest distance from the edge 13e of the groove 13 to the edge D2 of the through-hole TH surrounded by the groove 13 when viewed from the Z-axis direction.

Next, the cross-sectional configuration of the semiconductor photodetecting element according the present embodiment will be described with reference to FIG. 3. In FIG. 3, the glass substrate 30 and the optical adhesive OA are not illustrated.

Each avalanche photodiode APD includes the light receiving region S1. Each avalanche photodiode APD includes a first semiconductor region 1PA of a P-type (first conductivity type), a second semiconductor region 1NA of an N-type (second conductivity type), a third semiconductor region 1NB of an N-type, and a fourth semiconductor region 1PB of P-type.

The first semiconductor region 1PA is located at the principal surface 1Na side of the semiconductor substrate 50A. The second semiconductor region 1NA is located at the principal surface 1Nb side of the semiconductor substrate 50A. The third semiconductor region 1NB is located between the first semiconductor region 1PA and the second semiconductor region 1NA and has a lower impurity concentration than the second semiconductor region 1NA. The fourth semiconductor region 1PB is formed inside of the first semiconductor region 1PA and has a higher impurity concentration than the first semiconductor region 1PA. The fourth semiconductor region 1PB is the light receiving region S1. Each avalanche photodiode APD is configured to include: a $P^+$ layer serving as the fourth semiconductor region 1PB; a P layer serving as the first semiconductor region 1PA; an N layer serving as the third semiconductor region 1NB; and an $N^+$ layer serving as the second semiconductor region 1NA, which are arranged in this order from the principal surface 1Na.

The first semiconductor region 1PA is located in the intermediate area S2 when viewed from the Z-axis direction and is positioned to surround the fourth semiconductor region 1PB (light receiving region S1). Although not illustrated in the drawing, the first semiconductor region 1PA is also located in the intermediate area S2 between two mutually adjacent light receiving regions S1 when viewed from the Z-axis direction. The intermediate area S2 of the semiconductor substrate 50A is configured to include: a P layer serving as the first semiconductor region 1PA; an N layer serving as the third semiconductor region 1NB; and an N+ layer serving as the second semiconductor region 1NA, which are arranged in this order from the principal surface 1Na except the portion where the grooves 13, 14, and 15 are formed.

The inner surface 13b of the groove 13 is formed by the same N+ layer as the second semiconductor region 1NA. On the inner surface 13b, an insulating layer 13c is provided. A filling material 13a is provided in the area surrounded by the insulating layer 13c in the groove 13. The filling material 13a is made of, for example, a material that is easy to fill and has a high light shielding property. In the present embodiment, the filling material 13a is made of tungsten (W). Like the inner surface 13b, the inner surfaces of the grooves 14, 15 are formed by the same N+ layer as the second semiconductor region 1NA. Insulating layers 13c and filling materials 13a are provided in the grooves 14 and 15 like the groove 13. FIG. 3 does not illustrate the grooves 14 and 15, and the insulating layers 13c and the filling materials 13a provided in the grooves 14 and 15. The filling material 13a may be made of copper or aluminum instead of tungsten.

The depth of the grooves 13, 14, and 15, i.e., a distance from the principal surface 1Na to the bottom surfaces of the grooves 13, 14, and 15 in the Z-axis direction (the thickness direction of the semiconductor substrate 50A), is longer than a distance in the Z-axis direction from the principal surface 1Na to the interface between the second semiconductor region 1NA and the third semiconductor region 1NB, and shorter than the thickness of the semiconductor substrate 50A. The bottom surface 13d of the groove 13 is constituted by the second semiconductor region 1NA and is located closer to the principal surface 1Nb than the third semiconductor region 1NB. The bottom surfaces of the grooves 14 and 15 are also constituted by the second semiconductor region 1NA and are located closer to the principal surface 1Nb than the third semiconductor region 1NB.

The semiconductor substrate 50A includes an N-type fifth semiconductor region 1NC. The fifth semiconductor region 1NC is formed between the edge D2 of the through-hole TH and the first semiconductor region 1PA when viewed from the Z-axis direction. Like the second semiconductor region 1NA, the fifth semiconductor region 1NC is an N+ layer with a higher impurity concentration than the third semiconductor region 1NB. On the principal surface 1Na, an area where the fifth semiconductor region 1NC is formed is the opening peripheral area S3. The opening peripheral area S3 of the semiconductor substrate 50A is configured to include: an N+ layer serving as the fifth semiconductor region 1NC; and an N+ layer serving as the second semiconductor region 1NA, which are arranged in this order from the principal surface 1Na.

The inner peripheral surface (edge D2) of the through-hole TH is configured to include the fifth semiconductor region 1NC and the second semiconductor region 1NA, which are arranged in this order from the principal surface 1Na. Therefore, a PN junction formed by the first semiconductor region 1PA and the third semiconductor region 1NB is not exposed to the through-hole TH.

The avalanche photodiode APD includes an electrode E1. The connected portion C of the electrode E1 is connected to the fourth semiconductor region 1PB (light receiving region S1). As described above, the connected portion C includes the first end portion E1a and the second end portion E1b. The electrode E1 includes the third end portion E1c.

The first semiconductor region 1PA is electrically connected to the electrode E1 through the fourth semiconductor region 1PB.

The electrode pad 12 is electrically connected to the through-electrode TE. The through-electrode TE extends to the back side (adjacent to the principal surface 1Nb) of the semiconductor substrate 50A. The through-electrode TE is provided with an insulating layer L3 adjacent to the mounting substrate 20. The through-electrode TE is electrically connected to the mounting substrate 20 through a bump electrode BE on the back side of the semiconductor substrate 50A. The electrode E1 and the mounting substrate 20 are electrically connected to each other through the wiring F, the electrode pad 12, the through-electrode TE, and the bump electrode BE. The fourth semiconductor region 1PB is electrically connected to the mounting substrate 20 through the electrode E1, the wiring F, the electrode pad 12, the through-electrode TE, and the bump electrode BE. The bump electrode BE is made of, for example, solder.

The bump electrode BE is formed on the through-electrode TE extending on the principal surface 1Nb with an under bump metal (UBM), not illustrated, interposed therebetween. The UBM is made of a material with excellent electrical and physical connection with the bump electrode BE. The UBM is formed by, for example, an electroless plating method. The bump electrode BE is formed by, for example, a method of mounting a solder ball or a printing method.

Figure 4:
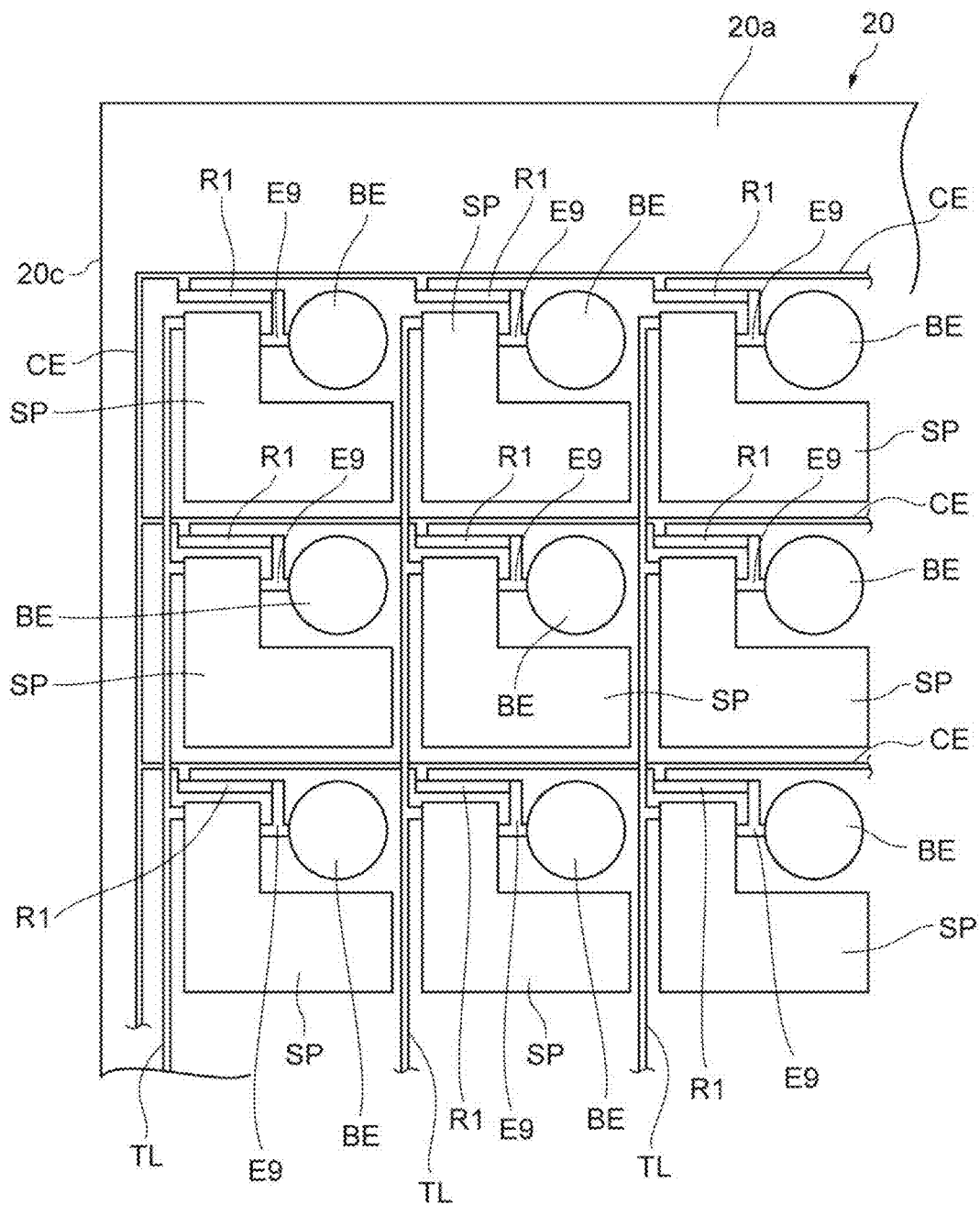
FIG. 4 is a schematic plan view describing a mounting substrate.

Next, the mounting substrate 20 according to the present embodiment will be described with reference to FIG. 4. FIG. 4 is a schematic plan view of the mounting substrate. As illustrated in FIG. 4, the mounting substrate 20 includes a plurality of electrodes E9, a plurality of quenching resistors R1, and a plurality of signal processing units SP. The mounting substrate 20 constitutes an application specific integrated circuit (ASIC). The quenching resistor R1 may be located at the semiconductor photodetecting element 10A instead of the mounting substrate 20.

Each electrode E9 is electrically connected to the bump electrode BE. The electrode E9 is made of a metal just like the electrode E1 and the through-electrode TE. The electrode E9 is made of, for example, aluminum. The material constituting the electrode E9 may be copper instead of aluminum.

Each quenching resistor R1 is disposed on the principal surface 20a side. One end of the quenching resistor R1 is electrically connected to the electrode E9, and the other end of the quenching resistor R1 is connected to a common electrode CE. The quenching resistor R1 constitutes a passive quenching circuit. A plurality of quenching resistors R1 are connected in parallel to the common electrode CE.

Each signal processing unit SP is located on the principal surface 20a side. An input terminal of the signal processing unit SP is electrically connected to the electrode E9 and an output terminal of the signal processing unit SP is connected to the signal line TL. Each signal processing unit SP receives an output signal from the corresponding avalanche photodiode APD (semiconductor photodetecting element 10A) through the electrode E1, the through-electrode TE, the bump electrode BE, and the electrode E9. Each signal processing unit SP processes the output signal from the corresponding avalanche photodiode APD. Each signal processing unit SP includes a CMOS circuit that converts the output signal from the corresponding avalanche photodiode APD into a digital pulse.

Figure 5:
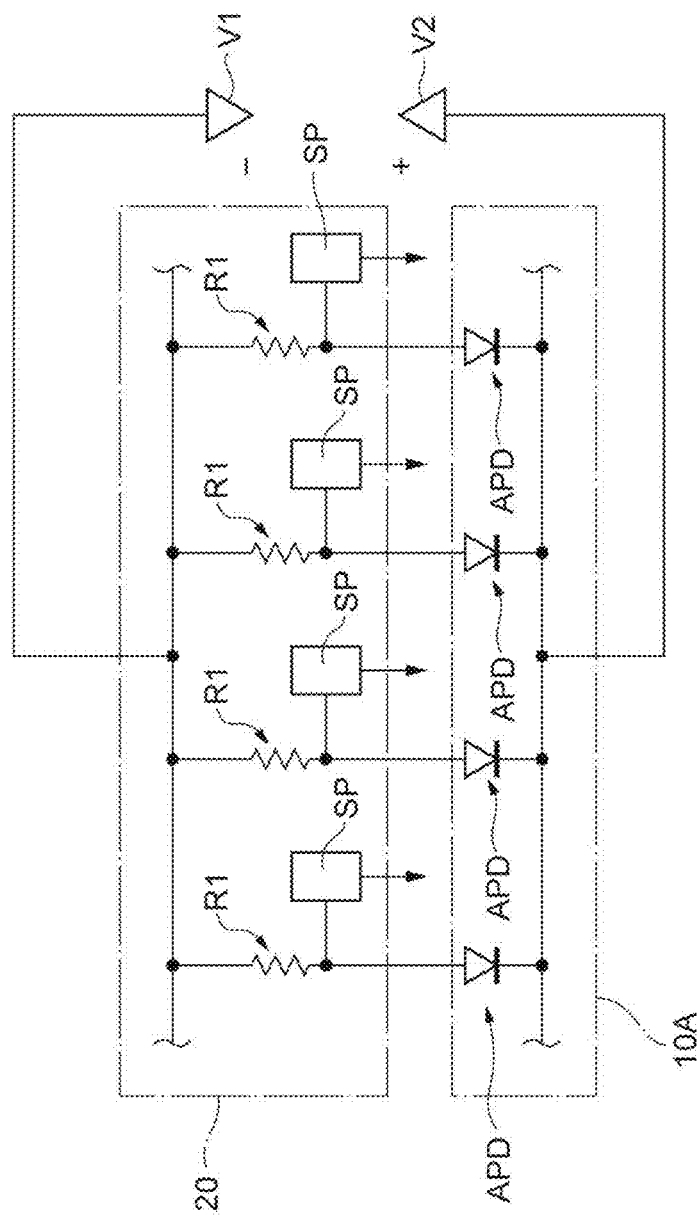
FIG. 5 is a circuit diagram of the photodetecting device.

Next, the circuit configuration of the photodetecting device 1 will be described with reference to FIG. 5. FIG. 5 is a circuit diagram of the photodetecting device. In the photodetecting device 1 (semiconductor photodetecting element 10A), an avalanche photodiode APD is formed by a PN junction formed between the N-type third semiconductor region 1NB and the P-type first semiconductor region 1PA. The semiconductor substrate 50A is electrically connected to an electrode (not illustrated) arranged on the back side, and the first semiconductor region 1PA is connected to the electrode E1 through the fourth semiconductor region 1PB. Each quenching resistor R1 is connected in series with the corresponding avalanche photodiode APD.

In the semiconductor photodetecting element 10A, each avalanche photodiode APD operates in Geiger mode. In Geiger mode, a reverse voltage (reverse bias voltage) greater than the breakdown voltage of the avalanche photodiode APD is applied to between the anode and the cathode of the avalanche photodiode APD. For example, a (−) potential V1 is applied to the anode and a (+) potential V2 is applied to the cathode. The polarities of these potentials are relative to each other, and one potential may be the ground potential.

The anode is the first semiconductor region 1PA and the cathode is the third semiconductor region 1NB. When light (photon) is incident on the avalanche photodiode APD, photoelectric conversion is performed inside of the substrate to generate photoelectrons. At an area near the PN junction interface of the first semiconductor region 1PA, avalanche multiplication is performed and the amplified electron group moves toward the electrode arranged on the back side of the semiconductor substrate 50A. When light (photon) is incident on any cell (avalanche photodiode APD) of the semiconductor photodetecting element 10A, the light is multiplied and obtained from the electrode E9 as a signal. The signal retrieved from the electrode E9 is input to the corresponding signal processing unit SP.

As described above, in the photodetecting device 1, each light receiving region S1 has a polygonal shape including a pair of first sides 16a and four second sides 16b when viewed from the Z-axis direction.

When the distance between a plurality of avalanche photodiodes is small, the aperture ratio is ensured but the detection accuracy of the photodetecting device may be deteriorated because of the crosstalk between adjacent avalanche photodiodes, as compared with when the distance between a plurality of avalanche photodiodes is large. In the Geiger mode-type avalanche photodiode, light emission may occur due to avalanche multiplication, and therefore, the avalanche photodiode may receive the light emitted by an adjacent avalanche photodiode. Therefore, the photodetecting device may output a detection result affected by the emission of the avalanche photodiode itself.

In photodetecting device 1, the polygonal shape of each light receiving region S1 includes a pair of first sides 16a. In the two avalanche photodiodes APD adjacent to each other in the row direction, the first sides 16a of them both oppose each other in the row direction. Therefore, the crosstalk described above may occur between the avalanche photodiodes APD adjacent to each other in the row direction. When the length of the first side 16a is short, the area where crosstalk occurs in two adjacent avalanche photodiodes APD in the row direction is small, as compared with when the length of the first side 16a is long.

It is difficult to reduce the size of the through-electrode TE because of problems in machining accuracy or ensuring electrical connection. When the length of the second side 16b opposite to the through-electrode TE is long, the dead space is large and it is difficult to ensure the aperture ratio, as compared with when the length of the second side 16b opposite to the through-electrode TE is short.

In the photodetecting device 1, the length of the first side 16a is shorter than the length of the second side 16b, and therefore, the aperture ratio is ensured and the occurrence of crosstalk between the avalanche photodiodes APD adjacent to each other in the row direction is suppressed.

In the photodetecting device 1, the polygonal shape of each light receiving region S1 includes a pair of third sides 16c. In the column direction, the third sides 16c of two adjacent avalanche photodiodes APD oppose each other in the column direction. For this reason, the crosstalk described above may occur between the avalanche photodiodes APD adjacent to each other in the column direction. When the length of the third side 16c is short, the area where crosstalk occurs in two avalanche photodiodes APD adjacent to each other in the column direction is small, as compared with when the length of the third side 16c is long.

In the photodetecting device 1, the length of the third side 16c is shorter than the length of the second side 16b, the aperture ratio is ensured and the occurrence of the crosstalk between the avalanche photodiodes APD adjacent to each other in the column direction is suppressed.

The distance between the light receiving regions S1 in the direction intersecting with the row direction and the column direction is larger than the distance between the light receiving regions S1 in the row direction or the column direction. In the direction intersecting with the row direction and the column direction, the through-electrode TE exists between the two light receiving regions S1. Therefore, the abovementioned crosstalk tends not to occur between avalanche photodiodes APD adjacent to each other in the direction intersecting with the row direction and the column direction.

The grooves 13, 14, and 15 surround the entire circumference of the light receiving region S1 on the principal surface 1Na side of the semiconductor substrate 50A. The groove 13 is formed in the intermediate area S2 between the light receiving region S1 and the through-electrode TE adjacent to the light receiving region S1, so that the aperture ratio is ensured, and an inflow of a surface leakage electric current to the avalanche photodiode APD is reduced. Since the grooves 14 and 15 are formed between the adjacent light receiving regions S1, crosstalk between avalanche photodiodes APD is further reduced.

A filling material 13a having a high light shielding property is arranged in the grooves 13, 14, and 15. Therefore, the photodetecting device 1 reduces the crosstalk between the avalanche photodiodes APD caused by the light emitted by the adjacent avalanche photodiode APD.

When the filling material 13a disposed in the grooves 13, 14, and 15 is made of a metal, a parasitic capacitance may be generated between the filling material 13a and the light receiving region S1. When the value of parasitic capacitance differs according to the position between the filling material 13a and the light receiving region S1, i.e., when the value of parasitic capacitance is deviated, the photodetection accuracy of the avalanche photodiode APD may be reduced.

The grooves 13, 14, and 15 extend along the sides of the light receiving regions S1 and surround each light receiving region S1. Therefore, even if a parasitic capacitance occurs between the filling material 13a and the light receiving region S1, the value of the parasitic capacitance is less likely to be deviated. As a result, in the photodetecting device 1, the influence of the parasitic capacitance on the avalanche photodiode APD is reduced.

In the groove 13, a filling material 13a made of tungsten is provided. Since the electrode pad 12 is spaced apart from the groove 13, the parasitic capacitance generated between the electrode pad 12 and the filling material 13a is reduced.

The groove 13 extends along the second sides 16b opposing each other in the two adjacent light receiving regions S1. The groove 14 extends along the first sides 16a opposing each other in the two adjacent light receiving regions S1. The groove 15 extends along the third sides 16c opposing each other in two adjacent light receiving regions S1. The groove 14 is shared by two light receiving regions S1 adjacent to each other in the row direction. That is, the groove 14 shares a portion formed between two light receiving regions S1 adjacent to each other in the row direction. In which case, the plurality of light receiving regions S1 are densely arranged in the row direction, as compared with when the groove does not share the portion formed between the two light receiving regions S1.

The groove 15 is shared by two light receiving regions S1 adjacent to each other in the column direction. That is, the groove 15 shares a portion formed between two light receiving regions S1 adjacent to each other in the column direction. In which case, a plurality of light receiving regions S1 are densely arranged in the column direction, as compared with when the groove does not share the portion formed between the two light receiving regions S1. In the photodetecting device 1, the plurality of light receiving regions S1 are densely arranged in the row direction and the column direction, and therefore, the aperture ratio is further improved. In the photodetecting device 1, as described above, the influence of the parasitic capacitance on the avalanche photodiode APD is reduced.

The total length of the four second sides 16b is equal to or more than 50% of the entire circumference of the light receiving region S1. In which case, the total length of the sides (a pair of first sides 16a and a pair of third sides 16c) defining the area between the adjacent avalanche photodiodes APD is less than half of the entire circumference of the light receiving region S1. Therefore, in the photodetecting device 1, the aperture ratio is ensured, and the occurrence of crosstalk between avalanche photodiodes is suppressed more greatly.

The groove 13 is formed in a narrow area between the through-hole TH and the light receiving region S1. For this reason, a structural defect may occur in the area between the groove 13 and the through-hole TH in the semiconductor substrate 50A. The structural defect is, for example, cracking or chipping of the semiconductor substrate 50A. When a distance β from an edge 13e of the groove 13 to an edge D2 of the through-hole TH is equal to or less than a distance α from the edge 13e of the groove 13 to the edge D1 of the light receiving region S1, a structural defect is likely to occur, as compared with when the distance β is longer than the distance α.

In the photodetecting device 1, the distance β is longer than the distance α. Therefore, structural defects tend not to be generated around the through-holes TH in the semiconductor substrate 50A.

The bottom surfaces of the grooves 13, 14, and 15 are constituted by the second semiconductor region 1NA. The bottom surface 13d of the groove 13 is located deeper than the third semiconductor region 1NB. Therefore, even when charges are generated in the area AR1, this suppresses movement of the charges generated in the area AR1 to the avalanche photodiode APD. The crosstalk between adjacent avalanche photodiodes caused by light emission of the avalanche photodiode APD is reduced due to the grooves 14 and 15. Since the bottom surfaces 13d of the grooves 13, 14, and 15 are formed in the semiconductor substrate 50A, i.e., the grooves 13, 14, and 15 do not reach the principal surface 1Nb of the semiconductor substrate 50A, the semiconductor substrate 50A will not be separated at the positions of the grooves 13, 14, and 15. Therefore, in the manufacturing process of the photodetecting device 1, the semiconductor substrate 50A is easily handled.

When viewed from the Z-axis direction, the area AR1 and the area AR2 have a polygonal shape and the light receiving region S1 has a polygonal shape. When the light receiving region S1 has a circular shape, there is no corner where the electric field concentrates. When the light receiving region S1 has a circular shape, the dead space generated between the light receiving region S1 and the through-hole TH is large, as compared with when the light receiving region S1 has a polygonal shape. Therefore, it is difficult to ensure the aperture ratio. The areas AR1 and AR2, and the light receiving region S1 have a polygonal shape. The areas AR1 and AR2 and the light receiving region S1 are arranged in such a manner that the sides of the areas AR1, AR2 are along the side of the light receiving region S1. Therefore, as compared with when the areas AR1 and AR2 and the light receiving region S1 do not have polygonal shapes, or when the sides of the areas AR1 and AR2 are not along the side of the light receiving region S1, the distance between the through-hole TH and the light receiving region S1 is narrow in the photodetecting device 1. For this reason, the photodetecting device 1 has a small dead space, and a high aperture ratio.

When viewed from the Z-axis direction, the opening of the through-hole TH has a circular shape, and the insulating layer L2 is arranged in the inner peripheral surface of the through-hole TH. Since the insulating layer L2 is disposed on the inner peripheral surface of the through-hole TH, the through-electrode TE and the semiconductor substrate 50A are electrically insulate from each other. When there is a corner at the opening of the through-hole TH, a crack may be formed at the corner of the insulating layer L2 when the insulating layer L2 is formed. In the present embodiment, since the through-hole TH has a circular shape when viewed from a direction perpendicular to the principal surface 1Na, cracks tend not to be generated in the insulating layer L2 when the insulating layer L2 is formed. Therefore, in the photodetecting device 1, electrical insulation between the through-electrode TE and the semiconductor substrate 50A is ensured.

The through-electrode TE is electrically connected to the light receiving region S1 of avalanche photodiode APD of one of the four mutually adjacent avalanche photodiodes APD. In which case, since the wiring distance between the through-electrode TE and the light receiving region S1 electrically connected to the through-electrode TE is relatively short, it is unsusceptible to influence by the wiring resistance and the parasitic capacitance. Therefore, this suppresses degradation of the detection accuracy of the photodetecting device 1.

In a case where the light receiving region S1 has a quadrilateral shape or a hexagonal shape when viewed from the Z-axis direction, the following problems may occur. In which case, the corners where electric field intensities are relatively high oppose each other between mutually adjacent light receiving regions S1. Therefore, a detection result in the photodetecting device 1 is affected by the electric field. In the present embodiment, the light receiving region S1 has the octagonal shape when viewed from the Z-axis direction. Therefore, the first sides 16a and the third sides 16c only oppose each other between respective mutually adjacent light receiving regions S1. As a result, detection results in the photodetecting device 1 tend not to be affected by the electric field. When the light receiving region S1 has an octagonal shape when viewed from the Z-axis direction, the area other than the through-electrode TE in the principal surface 1Na can be efficiently made use of. Therefore, the photodetecting device 1 achieves a configuration having a short wiring distance between the through-electrode TE and the light receiving region S1, and the aperture ratio is improved, as compared with in the case where the light receiving region S1 has other shapes.

Next, a configuration of a photodetecting device according to a modification of the present embodiment will be described with reference to FIG. 6. FIG. 6 is a diagram for describing a cross-sectional configuration of a photodetecting device according to the modification of the present embodiment. FIG. 6 illustrates a cross-sectional configuration obtained when the photodetecting device according to this modification is cut along the plane corresponding to line III-III illustrated in FIG. 2. FIG. 6 also does not illustrate the glass substrate 30 and the optical adhesive OA. The modification is generally similar or the same as the above-described embodiment, but the modification differs from the above-described embodiment in the configuration of the avalanche photodiodes APD, as described below.

The photodetecting device according to the present modification includes a semiconductor photodetecting element 10B. The semiconductor photodetecting element 10B is disposed between the mounting substrate 20 and the glass substrate 30. The semiconductor photodetecting element 10B includes a semiconductor substrate 50B having a rectangular shape in a plan view. The semiconductor substrate 50B is made of Si and is an N type (second conductivity type) semiconductor substrate. The semiconductor substrate 50B includes a principal surface 1Na and a principal surface 1Nb that oppose each other. The semiconductor photodetecting element 10B includes a plurality of avalanche photodiodes APD and a plurality of through-electrodes TE. The plurality of avalanche photodiodes APD are two-dimensionally arranged on the semiconductor substrate 50B. In the present modification, the avalanche photodiodes APD are arranged in a matrix.

The groove 23 formed in the semiconductor photodetecting element 10B has the same configuration as the groove 13 formed in the semiconductor photodetecting element 10A. The grooves 23, 14, and 15 surrounding the entire circumference of each light receiving region S1 are formed in the intermediate area S2 of the semiconductor substrate 50B. When viewed from Z-axis direction, the groove 23 is formed in the intermediate area S2 between the light receiving regions S1 of the four mutually adjacent avalanche photodiodes APD and the through-hole TH surrounded by these avalanche photodiodes APD. The groove 23 extends along the second sides 16b of the light receiving regions S1 when viewed from the Z-axis direction.

The grooves 14 and 15 are formed in the intermediate area S2 between the two mutually adjacent light receiving regions S1. The groove 14 extends along the first side 16a of each light receiving region S1. The groove 15 extends along the third side 16c of each light receiving region S1. The grooves 23, 14, and 15 extend along the sides of the light receiving regions S1, and surround the entire circumference of each light receiving region S1.

The entire circumference of the through-hole TH surrounded by the four mutually adjacent avalanche photodiodes APD is surrounded by the grooves 23 when viewed from the Z-axis direction. The grooves 14 and 15 connect the grooves 23 surrounding different through-holes TH when viewed from the Z-axis direction.

The area AR1 surrounded by the groove 23 is substantially square when viewed from the Z-axis direction. The area AR2 surrounded by the grooves 23, 14, and 15 has an octagonal shape. Each area AR1 and AR2 has a polygonal shape when viewed from the Z-axis direction.

In the semiconductor photodetecting element 10B, the groove 14 extending along the first side 16a of each light receiving region S1 is located on one straight line in the area between two adjacent light receiving regions S1. The groove 14 is shared by two adjacent light receiving regions S1. The groove 14 is not only a groove surrounding one light receiving region S1 at one side but also a groove surrounding the light receiving region S1 at the other side. The groove 15 extending along the third side 16c of each light receiving region S1 is located on one straight line in the area between two adjacent light receiving regions S1. The groove 15 is shared by two adjacent light receiving regions S1. The groove 15 is not only a groove surrounding the light receiving region S1 at one side but also a groove surrounding the light receiving region S1 at the other side. The groove 14 surrounding the two light receiving regions S1 adjacent to each other in the row direction shares a portion formed between two light receiving regions S1 adjacent to each other in the row direction. The groove 15 surrounding two light receiving regions S1 adjacent to each other in the column direction shares a portion formed between two adjacent light receiving regions in the column direction.

In the semiconductor photodetecting element 10B, each avalanche photodiode APD also includes the light receiving region S1. Each avalanche photodiode APD includes a first semiconductor region 2PA of P-type (first conductivity type), a second semiconductor region 2PB of P-type, a third semiconductor region 2NA of N-type, and a fourth semiconductor region 2PC of P-type.

The first semiconductor region 2PA is located at the principal surface 1Na side of the semiconductor substrate 50B. The second semiconductor region 2PB is located at the principal surface 1Nb side of the semiconductor substrate 50B, and has a higher impurity concentration than the first semiconductor region 2PA. The third semiconductor region 2NA is formed at the principal surface 1Na side of the first semiconductor region 2PA. The fourth semiconductor region 2PC is formed in the first semiconductor region 2PA to be in contact with the third semiconductor region 2NA and has a higher impurity concentration than the first semiconductor region 2PA. The third semiconductor region 2NA is the light receiving region S1. Each avalanche photodiode APD is configured to include: an $N^+$ layer serving as the third semiconductor region 2NA; a P layer serving as the fourth semiconductor region 2PC; a $P^-$ layer serving as the first semiconductor region 2PA; and a $P^+$ layer serving as the second semiconductor region 2PB, which are arranged in this order from the principal surface 1Na.

The first semiconductor region 2PA is located in the intermediate area S2 when viewed from the Z-axis direction and is positioned to surround the third semiconductor region 2NA that is the light receiving region S1. Although not illustrated in the drawing, the first semiconductor region 2PA is also located in the intermediate area S2 between two mutually adjacent light receiving regions S1 when viewed from the Z-axis direction. The intermediate area S2 of the semiconductor substrate 50B is configured to include: a $P^-$ layer serving as the first semiconductor region 2PA; and a $P^+$ layer serving as the second semiconductor region 2PB, which are arranged in this order from the principal surface 1Na except the portion where the grooves 23, 14, 15 are formed.

The inner surface 23b of the groove 23 is formed by the same P+ layer as the second semiconductor region 2PB. On the inner surface 23b, an insulating layer 23c is provided. A filling material 23a is provided in the area surrounded by the insulating layer 23c in the groove 23. The filling material 23a is made of, for example, a material that is easy to fill and has a high light shielding property. In the present modification, the filling material 23a is made of tungsten (W), which is the same as the filling material 13a. Like the inner surface 23b, the inner surface of the groove 14 is formed by the P+ layer having a higher impurity concentration than the first semiconductor region 2PA. An insulating layer 23c and a filling material 23a are provided in the grooves 14 like the groove 23. As described above, FIG. 6 does not illustrate the grooves 14 and 15, and the insulating layers 23c and the filling materials 23a provided in the grooves 14 and 15. The filling material 13a may be made of copper or aluminum instead of tungsten.

The depth of the grooves 23, 14, and 15, i.e., a distance from the principal surface 1Na to the bottom surfaces of the grooves 23, 14, and 15 in the Z-axis direction (the thickness direction of the semiconductor substrate 50B), is longer than a distance in the Z-axis direction from the principal surface 1Na to the interface between the first semiconductor region 2PA and the second semiconductor region 2PB, and shorter than the thickness of the semiconductor substrate 50B. The bottom surface 23d of the groove 23 is constituted by the second semiconductor region 2PB and is located closer to the principal surface 1Nb than the first semiconductor region 2PA. The bottom surfaces of the grooves 14 and 15 are also constituted by the second semiconductor region 1NA and are located closer to the principal surface 1Nb than the third semiconductor region 1NB.

The semiconductor substrate 50B includes a P-type fifth semiconductor region 2PD. The fifth semiconductor region 2PD is formed between the edge D2 of the through-hole TH and the first semiconductor region 2PA when viewed from the Z-axis direction. Like the second semiconductor region 2PB, the fifth semiconductor region 2PD is a P+ layer with a higher impurity concentration than the first semiconductor region 2PA. On the principal surface 1Na, an area where the fifth semiconductor region 2PD is formed is the opening peripheral area S3. The opening peripheral area S3 of the semiconductor substrate 50B is configured to include: a P+ layer serving as the fifth semiconductor region 2PD; and a P+ layer serving as the second semiconductor region 2PB, which are arranged in this order from the principal surface 1Na.

The inner peripheral surface (edge D2) of the through-hole TH is configured to include the fifth semiconductor region 2PD and the second semiconductor region 2PB, which are arranged in this order from the principal surface 1Na. Therefore, a PN junction formed by the third semiconductor region 2NA and the fourth semiconductor region 2PC is not exposed to the through-hole TH.

The avalanche photodiode APD includes an electrode E1. The electrode E1 is arranged at the principal surface 1Na side of the semiconductor substrate 50B. In the present modification, the electrode E1 is provided along the contour of the light receiving region S1 and has an octagonal ring shape.

The electrode E1 includes a connected portion C that is electrically connected to the light receiving region S1. In the present modification, as illustrated in FIG. 6, the connected portion C includes a first end portion E1a and a second end portion E1b. The electrode E1 includes a third end portion E1c that is electrically connected to the wiring F.

As illustrated in FIG. 6, the wiring F extends from the third end portion E1c in the direction opposite to the center of the light receiving region S1. The wiring F electrically connects the electrode E1 and an electrode pad 12. The wiring F is located above the semiconductor substrate 50B outside of the light receiving region S1. The wiring F is formed above the semiconductor substrate 50B with an insulating layer L1 interposed therebetween.

In the present modification, the electrode pad 12 is also electrically connected to the through-electrode TE. The through-electrode TE extends to the back side (adjacent to the principal surface 1Nb side) of the semiconductor substrate 50B. The through-electrode TE is provided with an insulating layer L3. The through-electrode TE is electrically connected to the mounting substrate 20 via the bump electrode BE. The electrode E1 and the mounting substrate 20 are electrically connected to each other through the wiring F, the electrode pad 12, the through-electrode TE, and the bump electrode BE. The third semiconductor region 2NA is electrically connected to the mounting substrate 20 through the electrode E1, the wiring F, the electrode pad 12, the through-electrode TE, and the bump electrode BE.

In the present modification, the length of the first side 16a is shorter than the length of the second side 16b, and therefore, the aperture ratio is ensured and the occurrence of crosstalk between the avalanche photodiodes APD adjacent to each other in the row direction is suppressed.

The length of the third side 16c is also shorter than the length of the second side 16b, and therefore, the aperture ratio is ensured and the occurrence of crosstalk between the avalanche photodiodes APD adjacent to each other in the column direction is suppressed.

The bottom surface 23d of the groove 23 is constituted by the second semiconductor region 2PB. The bottom surface 23d of the groove 23 is located deeper than the first semiconductor region 2PA. Therefore, even when charges are generated in the area surrounded by the groove 23 in the semiconductor substrate 50B, this suppresses movement of the charges generated in the area to the avalanche photodiode APD. Since the bottom surface 23d of the groove 23 is formed in the semiconductor substrate 50B, i.e., the groove 23 does not reach the principal surface 1Nb of the semiconductor substrate 50B, the semiconductor substrate 50B will not be separated at the position of the groove 23. Therefore, in the manufacturing process of the photodetecting device according to the present modification, the semiconductor substrate 50B is easily handled.

Next, the configurations of modifications of the semiconductor photodetecting element will be described with reference to FIG. 7 to FIG. 11. FIG. 7 to FIG. 11 are schematic plan views illustrating the modifications of the semiconductor photodetecting element.

Semiconductor photodetecting elements 10C, 10D, 10E, 10F, and 10G are disposed between a mounting substrate 20 and a glass substrate 30. Like the semiconductor photodetecting element 10A, the semiconductor photodetecting elements 10C, 10D, 10E, 10F, and 10G include a semiconductor substrate 50A having a rectangular shape in a plan view. The semiconductor photodetecting elements 10C, 10D, 10E, 10F, and 10G include a plurality of avalanche photodiodes APD and a plurality of through-electrodes TE.

Figure 7:
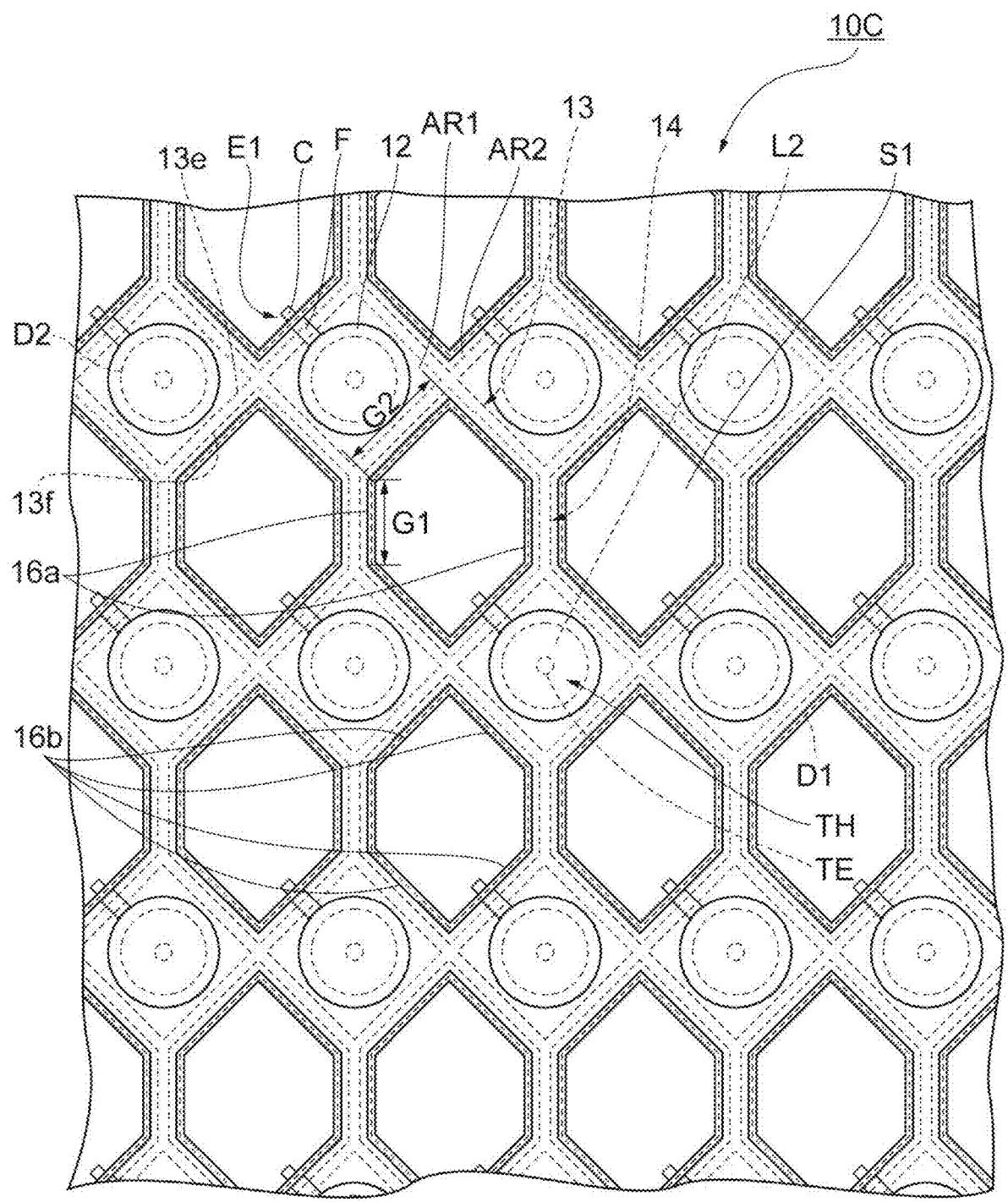
FIG. 7 is a schematic plan view illustrating a modification of a semiconductor photodetecting element.

In the semiconductor photodetecting element 10C illustrated in FIG. 7, the plurality of light receiving regions S1 have a hexagonal shape when viewed from the Z-axis direction. The plurality of light receiving regions S1 are two-dimensionally arranged when viewed from the Z-axis direction. In the present modification, the plurality of light receiving regions S1 are arranged in a matrix. The row direction is X-axis direction and the column direction is Y-axis direction. The light receiving regions S1 are arranged with an equal distance on a straight line when viewed from each of the X-axis direction and the Y-axis direction. The light receiving regions S1 of the semiconductor photodetecting element 10C are arranged with a pitch of 66.6 µm in the row direction and are arranged with a pitch of 100 µm in the column direction.

In the avalanche photodiode APD of the semiconductor photodetecting element 10C, the electrodes E1 are provided along the contour of the light receiving region S1 and have a hexagonal ring shape. The electrode E1 includes a connected portion C which is electrically connected to the light receiving region S1. The connected portion C is provided on one side of the light receiving region S1.

In the semiconductor photodetecting element 10C, the hexagonal shape of each light receiving region S1 includes a pair of first sides 16a and four second sides 16b. The pair of first sides 16a oppose each other in the row direction and extend in the column direction. The four second sides 16b oppose the four through-electrodes TE surrounding the light receiving region S1 and extend in the direction intersecting with the row direction and the column direction.

Each first side 16a opposes the side of the adjacent light receiving region S1. The four second sides 16b oppose the through-holes TH located next to the light receiving region S1. One through-hole TH is surrounded from four directions, and surrounded by the second sides 16b of the four light receiving regions S1. The connected portion C is provided on the second side 16b. A length G1 of the first side 16a is shorter than a length G2 of the second side 16b. The total length of the four second sides 16b is equal to or more than 50% of the entire circumference of the light receiving region S1. In the present modification, the length G1 of each of the first sides 16a is shorter than the length G2 of each of the second sides 16b. Each of the first sides 16a may have substantially the same length. Each of the second sides 16b may have substantially the same length.

In the semiconductor photodetecting element 10C, the principal surface 1Na of the semiconductor substrate 50A includes the light receiving region S1, an intermediate area S2, and an opening peripheral area S3. The opening peripheral area S3 is an area located at the periphery of the opening of the through-hole TH of the principal surface 1Na. The intermediate area S2 is an area excluding the light receiving region S1 and the opening peripheral area S3 in the principal surface 1Na.

Grooves 13, 14 surrounding the entire circumference of each light receiving region S1 are formed in the intermediate area S2 of the semiconductor substrate 50A. When viewed from the Z-axis direction, the groove 13 is formed in the intermediate area S2 between the light receiving regions S1 of each of the four mutually adjacent avalanche photodiodes APD and the through-hole TH surrounded by these avalanche photodiodes APD. The groove 13 extends along the second side 16b of each light receiving region S1 when viewed from the Z-axis direction. The groove 14 is formed in the intermediate area S2 between the two mutually adjacent light receiving regions S1. The groove 14 extends along the first side 16a of each light receiving region S1.

The entire circumference of the through-hole TH surrounded by the four mutually adjacent avalanche photodiodes APD is surrounded by the grooves 13 when viewed from the Z-axis direction. The groove 14 connects the grooves 13 surrounding different through-holes TH when viewed from the Z-axis direction.

The area AR1 surrounded by the groove 13 is a substantially square when viewed from the Z-axis direction. The area AR2 surrounded by the grooves 13 and 14 has a hexagonal shape. Each area AR1, AR2 has a polygonal shape when viewed from the Z-axis direction.

In the semiconductor photodetecting element 10C, the groove 14 extending along the first side 16a of each light receiving region S1 is located on one straight line in the area between two adjacent light receiving regions S1. The groove 14 is shared by two adjacent light receiving regions S1. The groove 14 is not only a groove surrounding one light receiving region S1 at one side but also a groove surrounding the light receiving region S1 at the other side. The groove 14 surrounding the two light receiving regions S1 adjacent to each other in the row direction shares a portion formed between two light receiving regions S1 adjacent to each other in the row direction.

In the present modification, the length of the first side 16a is also shorter than the length of the second side 16b, and therefore, the aperture ratio is ensured and the occurrence of crosstalk between the avalanche photodiodes adjacent to each other in the row direction is suppressed.

The grooves 13 and 14 surround the entire circumference of the light receiving region S1 on the principal surface 1Na side of the semiconductor substrate 50A. The groove 13 is formed in the intermediate area S2 between the light receiving region S1 and the through-electrode TE adjacent to the light receiving region S1, so that the aperture ratio is ensured, and an inflow of a surface leakage electric current to the avalanche photodiode APD is reduced. Since the groove 14 is formed between the adjacent light receiving regions S1, crosstalk between avalanche photodiodes APD is further reduced.

The grooves 13 and 14 extend along the sides of the light receiving regions S1 and surround each light receiving region S1. Therefore, even if a parasitic capacitance occurs between the filling material 13a and the light receiving region S1, the value of the parasitic capacitance is less likely to be deviated. As a result, in the present modification, the influence of the parasitic capacitance on the avalanche photodiode APD is reduced.

The groove 13 extends along the second sides 16b opposing each other in the two adjacent light receiving regions S1. The groove 14 extends along the first sides 16a opposing each other in the two adjacent light receiving regions S1. The groove 14 is shared by two light receiving regions S1 adjacent to each other in the row direction. The groove 14 shares a portion formed between two light receiving regions S1 adjacent to each other in the row direction. In which case, the plurality of light receiving regions S1 are densely arranged in the row direction, as compared with when the groove does not share the portion formed between the two light receiving regions S1. In the present modification, as described above, the influence of the parasitic capacitance on the avalanche photodiode APD is reduced.

When viewed from the Z-axis direction, the area AR1 and the area AR2 have a polygonal shape and the light receiving region S1 has a polygonal shape. When the light receiving region S1 has a circular shape, there is no corner where the electric field concentrates. When the light receiving region S1 has a circular shape, the dead space generated between the light receiving region S1 and the through-hole TH is large, as compared with when the light receiving region S1 has a polygonal shape. Therefore, it is difficult to ensure the aperture ratio. The areas AR1 and AR2, and the light receiving region S1 have a polygonal shape. The areas AR1, AR2 and the light receiving region S1 are arranged in such a manner that the sides of the areas AR1 and AR2 are along the side of the light receiving region S1. Therefore, as compared with when the areas AR1 and AR2 and the light receiving region S1 do not have polygonal shapes, or when the sides of the areas AR1 and AR2 are not along the side of the light receiving region S1, the distance between the through-hole TH and the light receiving region S1 is narrow in the present modification. For this reason, the present modification has a small dead space, and a high aperture ratio.

Figure 8:
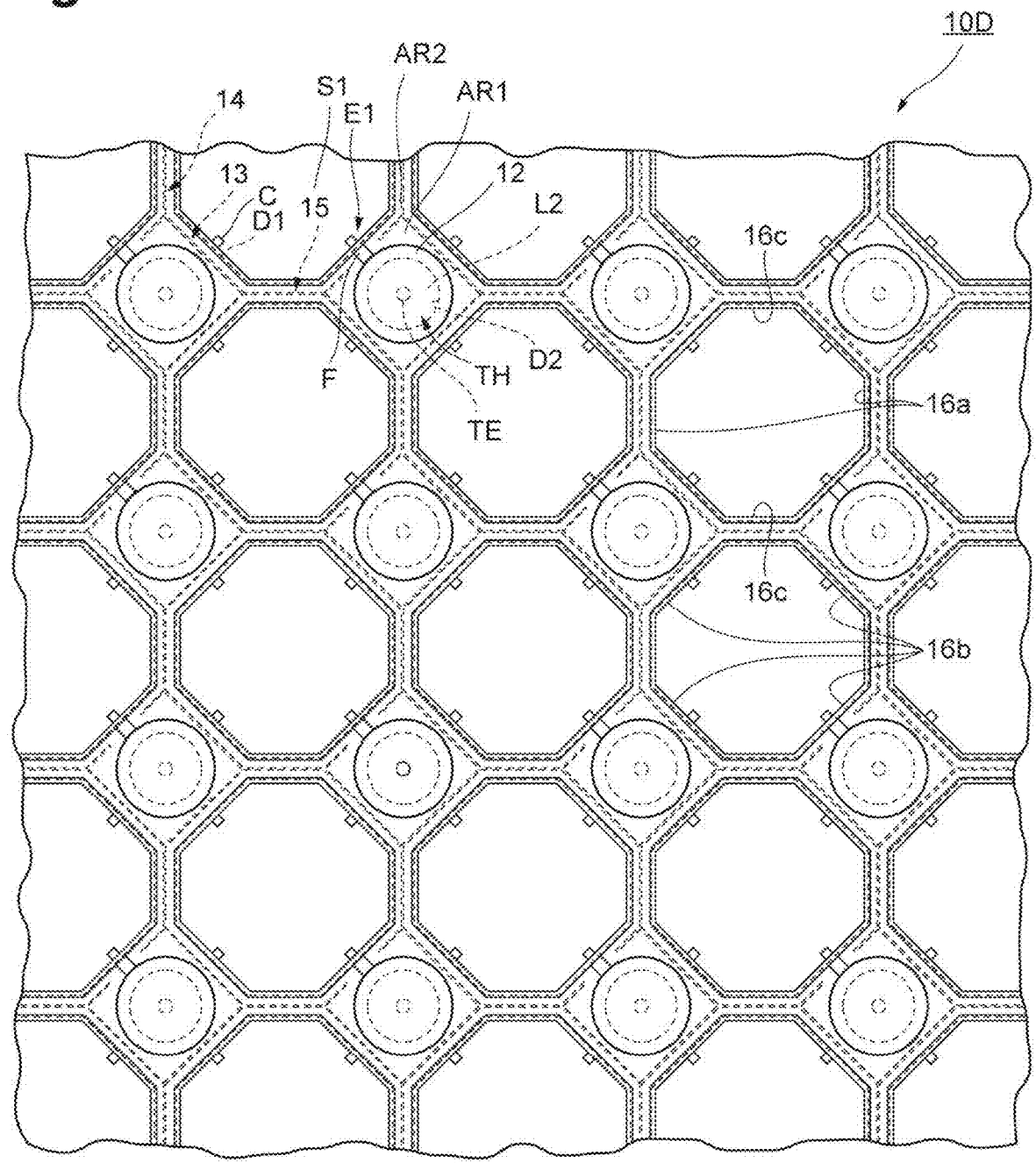
FIG. 8 is a schematic plan view illustrating a modification of a semiconductor photodetecting element.

In the semiconductor photodetecting element 10D as illustrated in FIG. 8, a groove 13 is formed in an intermediate area S2 between the through-hole TH and the light receiving region S1 adjacent to the through-hole TH. The groove 13 surrounds the through-hole TH. The groove 13 is not formed in an area arranged with the wiring F that electrically connects the through-electrode TE and the light receiving region S1 when viewed from the Z-axis direction. The groove 13 surrounds the through-hole TH in such a state that the groove 13 is divided by the area where the wiring F is arranged when viewed from the Z-axis direction.

In the semiconductor photodetecting element 10D, the length of the first side 16a is shorter than the length of the second side 16b, and therefore, the aperture ratio is ensured and the occurrence of crosstalk between the avalanche photodiodes APD adjacent to each other in the row direction is suppressed.

The length of the third side 16c is also shorter than the length of the second side 16b, and therefore, the aperture ratio is ensured and the occurrence of crosstalk between the avalanche photodiodes APD adjacent to each other in the column direction is suppressed.

The distance between the light receiving regions S1 in the direction intersecting with the row direction and the column direction is larger than the distance between the light receiving regions S1 in the row direction or the column direction. In the direction intersecting with the row direction and the column direction, the through-electrode TE exists between the two light receiving regions S1. Therefore, the above-mentioned crosstalk tends not to occur between avalanche photodiodes APD adjacent to each other in the direction intersecting with the row direction and the column direction. Therefore, even when the groove 13 is divided in the area in which the wiring F is arranged, this tends not to affect occurrence of crosstalk.

Figure 9:
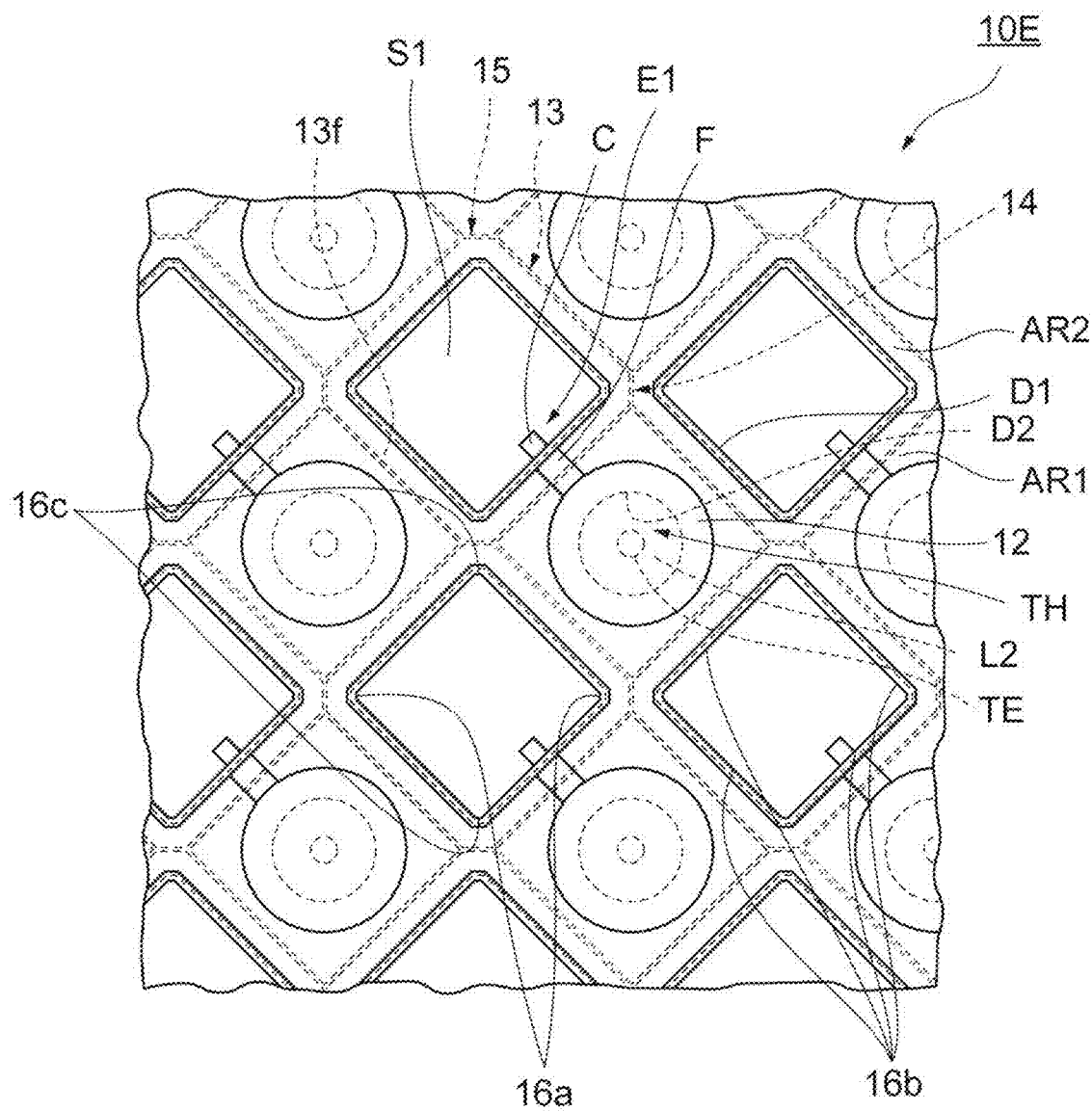
FIG. 9 is a schematic plan view illustrating a modification of a semiconductor photodetecting element.

In the semiconductor photodetecting element 10E as illustrated in FIG. 9, a groove 13 is formed in the intermediate area S2 between a through-hole TH and the light receiving region S1 adjacent to the through-hole TH. The groove 13 surrounds the through-hole TH. FIG. 2 and FIG. 9 are scaled differently. The size of the electrode pad 12 of the semiconductor photodetecting element 10D is the same as the size of the electrode pad 12 of the semiconductor photodetecting element 10A.

In the semiconductor photodetecting element 10E, the pitch of the through-hole TH is the same as the pitch of the through-hole TH of the semiconductor photodetecting element 10A, and the pitch of the light receiving region S1 is the same as the pitch of the light receiving region S1 of the semiconductor photodetecting element 10A. The through-hole TH and the light receiving region S1 are arranged in such a manner that the through-hole TH and the light receiving region S1 are in a one-to-one relationship. The light receiving region S1 of the semiconductor photodetecting element 10E has a substantially octagonal shape like the light receiving region S1 of the semiconductor photodetecting element 10A. The area of the light receiving region S1 of the semiconductor photodetecting element 10E is smaller than the area of the light receiving region S1 of the semiconductor photodetecting element 10A. The groove 14 is shared by two light receiving regions S1 adjacent to each other in the row direction. A single groove 14 is formed between two light receiving regions S1 adjacent to each other in the row direction. The groove 15 is shared by two light receiving regions S1 adjacent to each other in the column direction. A single groove 15 is formed between two light receiving regions S1 adjacent to each other in the column direction.

In the semiconductor photodetecting element 10E, the groove 13 surrounds the through-hole TH like the semiconductor photodetecting element 10A. The grooves 14 and 15 are formed in the intermediate area S2 between two mutually adjacent light receiving regions S1. The groove 14 extends along the first side 16a of each light receiving region S1 when viewed from the Z-axis direction. The groove 15 extends along the third side 16c of each light receiving region S1 when viewed from the Z-axis direction. The grooves 14 and 15 connect the grooves 13 surrounding different through-holes TH when viewed from the Z-axis direction. In the semiconductor photodetecting element 10E, the entire circumference of the light receiving region S1 is surrounded by the grooves 13, 14, and 15.

In the semiconductor photodetecting element 10E, the pitch of the through-hole TH is the same as the pitch of the through-hole TH of the semiconductor photodetecting element 10A, and the pitch of the light receiving region S1 is the same as the pitch of the light receiving region S1 of the semiconductor photodetecting element 10A. In the semiconductor photodetecting element 10E, the groove 14 is shared by two light receiving regions S1 adjacent to each other in the row direction, and the groove 15 is shared by two light receiving regions S1 adjacent to each other in the column direction. In which case, a plurality of light receiving regions S1 are densely arranged in the row direction and the column direction, as compared with when the groove does not share the portion formed between the two light receiving regions S1. In the present modification, the effect of the parasitic capacitance on the avalanche photodiode APD is reduced.

It is difficult to reduce the size of the through-electrode TE because of problems in machining accuracy or ensuring electrical connection. In order to reduce the parasitic capacitance generated between the electrode pad 12 and the filling material 13a in the groove 13, the groove 13 is separated from the electrode pad 12. In order to improve the aperture ratio, the light receiving region S1 has a polygonal shape.

Under these conditions, the light receiving region S1 of the semiconductor photodetecting element 10E has a polygonal shape different from the light receiving region S1 of the semiconductor photodetecting element 10A. In the light receiving region S1 of the semiconductor photodetecting element 10E, a length of the first side 16a is much shorter than a length of the second side 16b, and a length of the third side 16c is much shorter than the length of the second side 16b.

With this configuration, in the semiconductor photodetecting element 10E, the resolution is higher than that of the semiconductor photodetecting element 10A, and the semiconductor photodetecting element 10E achieves a higher aperture ratio. The parasitic capacitance generated among the avalanche photodiode APD, the filling material 13a, and the electrode pad 12 is reduced.

In the semiconductor photodetecting element 10E, the length of the first side 16a is shorter than the length of the second side 16b, and therefore, the aperture ratio is ensured and the occurrence of crosstalk between the avalanche photodiodes APD adjacent to each other in the row direction is suppressed.

The length of the third side 16c is also shorter than the length of the second side 16b, and therefore, the aperture ratio is ensured and the occurrence of crosstalk between the avalanche photodiodes APD adjacent to each other in the column direction is suppressed.

Figure 10:
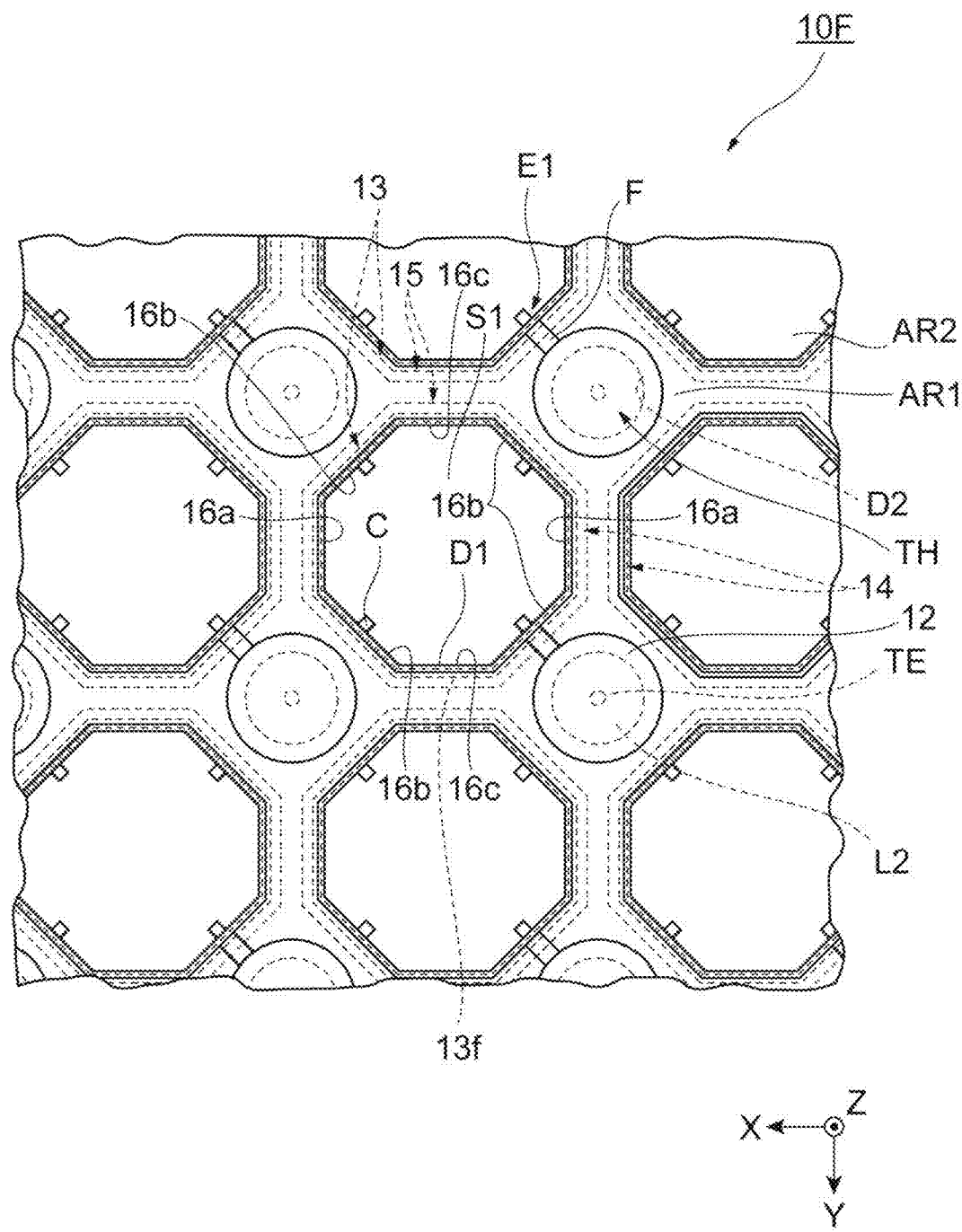
FIG. 10 is a schematic plan view illustrating a modification of a semiconductor photodetecting element.

In the semiconductor photodetecting element 10F illustrated in FIG. 10, the groove 13 is formed in the intermediate area S2 between the through-hole TH and the light receiving region S1 adjacent to the through-hole TH. The groove 13 surrounds the through-hole TH. FIG. 2 and FIG. 10 are scaled differently. The size of the electrode pad 12 of the semiconductor photodetecting element 10E is the same as the size of the electrode pad 12 of the semiconductor photodetecting element 10A.

In the semiconductor photodetecting element 10F, the pitch of the through-hole TH is the same as the pitch of the through-hole TH of the semiconductor photodetecting element 10A, the pitch of the light receiving region S1 is the same as the pitch of the light receiving region S1 of the semiconductor photodetecting element 10A. The through-hole TH and the light receiving region S1 are arranged in such a manner that the through-hole TH and the light receiving region S1 are arranged in a one-to-one relationship. Like the light receiving region S1 of the semiconductor photodetecting element 10A, the light receiving region S1 of the semiconductor photodetecting element 10F has a substantially octagonal shape. A length of the first side 16a is shorter than a length of the second side 16b, and a length of the third side 16c is shorter than the length of the second side 16b.

In the semiconductor photodetecting element 10F, the groove 13 is divided in the row direction and the column direction in which the through-holes TH are arranged, and the groove 13 surrounds the through-hole TH. The groove 14 extends along the first side 16a of the light receiving region S1 when viewed from the Z-axis direction. The groove 15 extends along the third side 16c of the light receiving region S1 when viewed from the Z-axis direction. The grooves 14 and 15 connect the grooves 13 surrounding different through-holes TH when viewed from the Z-axis direction. In the semiconductor photodetecting element 10F, the entire circumference of the light receiving region S1 is surrounded by the grooves 13, 14, and 15.

In order to reduce the influence of the parasitic capacitance on the avalanche photodiode APD, the groove 13 is formed along the second side 16b of the light receiving region S1, the groove 14 is formed along the first side 16a of the light receiving region S1, the groove 15 is formed along the third side 16c of the light receiving region S1. It is difficult to reduce the size of the through-electrode TE, because of problems in machining accuracy or ensuring electrical connection. In order to reduce the parasitic capacitance generated between the electrode pad 12 and the filling material 13a disposed in the groove 13, the groove 13 is separated from the electrode pad 12.

The groove 14 is not shared with two light receiving regions S1 adjacent to each other in the row direction and the groove 15 is not shared with two light receiving regions S1 adjacent to each other in the column direction. Under these conditions, the area of the light receiving region S1 in the octagonal shape is smaller than the area of the light receiving region S1 of the semiconductor photodetecting element 10A. In the semiconductor photodetecting element 10F, two grooves 14 extend in the area between two light receiving regions S1 adjacent to each other in the row direction. One of the grooves 14 surrounds one of the light receiving regions S1 and the other of the grooves 14 surrounds the other of the light receiving regions S1. Two grooves 15 extend in the area between two light receiving regions S1 adjacent to each other in the column direction. One of the grooves 15 surrounds one of the light receiving regions S1 and the other of the grooves 15 surrounds the other of the light receiving regions S1.

According to the above configuration, in the semiconductor photodetecting element 10F, the crosstalk between the light receiving regions S1 is reduced more greatly than the semiconductor photodetecting element 10A. Therefore, in the semiconductor photodetecting element 10F, the crosstalk between the light receiving regions S1 is lower than that of the semiconductor photodetecting element 10A, and the parasitic capacitance generated among the avalanche photodiode APD, the filling material 13a, and the electrode pad 12 is reduced.

In the semiconductor photodetecting element 10F, the length of the first side 16a is shorter than the length of the second side 16b, and therefore, the aperture ratio is ensured and the occurrence of crosstalk between the avalanche photodiodes APD adjacent to each other in the row direction is suppressed.

The length of the third side 16c is also shorter than the length of the second side 16b, and therefore, the aperture ratio is ensured and the occurrence of crosstalk between the avalanche photodiodes APD adjacent to each other in the column direction is suppressed.

Figure 11:
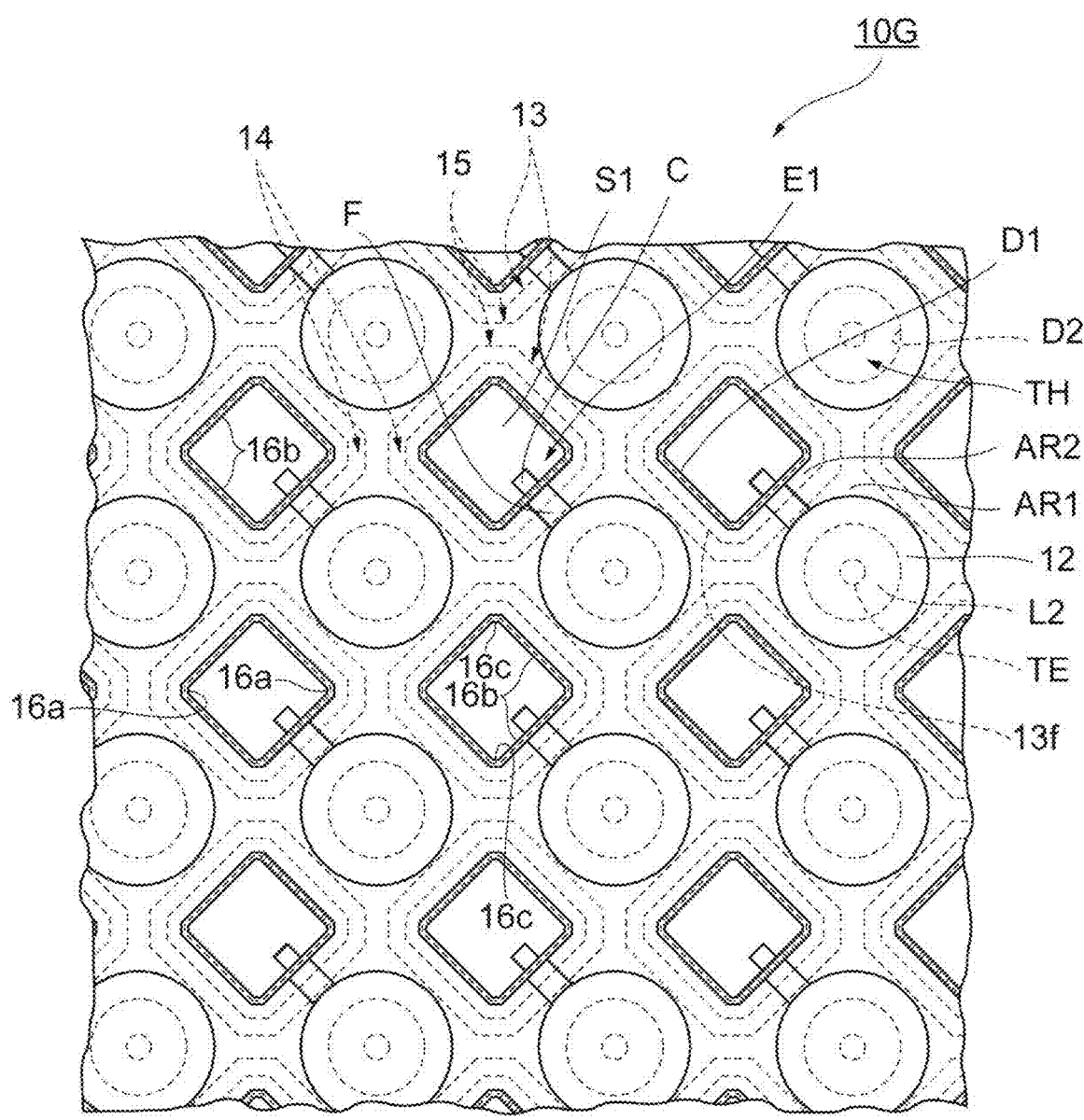
FIG. 11 is a schematic plan view illustrating a modification of a semiconductor photodetecting element.

In the semiconductor photodetecting element 10G illustrated in FIG. 11, the groove 13 is formed in the intermediate area S2 between the through-hole TH and the light receiving region S1 adjacent to the through-hole TH. The groove 13 surrounds the through-hole TH. FIG. 10 and FIG. 11 are scaled differently. The size of the electrode pad 12 of the semiconductor photodetecting element 10G is the same as the size of the electrode pad 12 of the semiconductor photodetecting element 10F.

The through-holes TH and the light receiving regions S1 are two-dimensionally arranged. Each pitch of the through-hole TH and the light receiving region S1 is less than those of the semiconductor photodetecting element 10F. In the semiconductor photodetecting element 10G, the through-hole TH and the light receiving region S1 are arranged in a one-to-one relationship to achieve a higher resolution than the semiconductor photodetecting element 10F. Each pitch of the light receiving region S1 and the through-hole TH is, for example, 50 μm.

In the semiconductor photodetecting element 10G, the groove 13 surrounds the through-hole TH in such a state that the grooves 13 are separated in the row direction and the column direction in which the through-holes TH are arranged. The groove 14 extends along the first side 16a of the light receiving regions S1 when viewed from the Z-axis direction. The groove 15 extends along the third side 16c of the light receiving regions S1 when viewed from the Z-axis direction. The grooves 14 and 15 connect the grooves 13 surrounding different through-holes TH when viewed from the Z-axis direction. In the semiconductor photodetecting element 10G, the entire circumference of the light receiving region S1 is surrounded by the grooves 13, 14, and 15.

In order to reduce the influence of the parasitic capacitance on the avalanche photodiode APD, the groove 13 is formed along the second side 16b of the light receiving region S1, the groove 14 is formed along the first side 16a of the light receiving region S1, the groove 15 is formed along the third side 16c of the light receiving region S1. It is difficult to reduce the size of the through-electrode TE because of problems in machining accuracy or ensuring electrical connection. In order to reduce the parasitic capacitance generated between the electrode pad 12 and the filling material 13a in the groove 13, the groove 13 is separated from the electrode pad 12.

Under these conditions, the grooves 14 and 15 are not shared by two adjacent light receiving regions S1. The light receiving region S1 of the semiconductor photodetecting element 10G has a polygonal shape different from the light receiving region S1 of the semiconductor photodetecting element 10F. More specifically, in the light receiving region S1 of the semiconductor photodetecting element 10G, a length of the first side 16a is much shorter than a length of the second side 16b, and a length of the third side 16c is much shorter than the length of the second side 16b.

With this configuration, in the semiconductor photodetecting element 10G, the resolution is higher than that of the semiconductor photodetecting element 10F, and the semiconductor photodetecting element 10G achieves a higher aperture ratio. The parasitic capacitance generated among the avalanche photodiode APD, the filling material 13a, and the electrode pad 12 is reduced.

In the semiconductor photodetecting element 10G, the length of the first side 16a is shorter than the length of the second side 16b, and therefore, the aperture ratio is ensured and the occurrence of crosstalk between the avalanche photodiodes APD adjacent to each other in the row direction is suppressed.

The length of the third side 16c is also shorter than the length of the second side 16b, and therefore, the aperture ratio is ensured and the occurrence of crosstalk between the avalanche photodiodes APD adjacent to each other in the column direction is suppressed.

Although the preferred embodiments and modifications of the present invention have been described above, the present invention is not necessarily limited to the above-described embodiments and modifications, and various modifications can be made without departing from the gist thereof.

In the above-described embodiment and modifications, a single avalanche photodiode APD is electrically connected to a single through-electrode TE (a single electrode pad 12), but the present embodiment and modifications are not limited thereto. A plurality of avalanche photodiodes APD may be electrically connected to a single through-electrode TE (a single electrode pad 12).

In the above-described embodiment and modifications, two types of layer structures, i.e., the semiconductor substrate 50A and the semiconductor substrate 50B, are illustrated as the avalanche photodiode APD, but the layer structure of the semiconductor substrate is not limited thereto. In the avalanche photodiode APD provided in the semiconductor substrate 50A, for example, the second semiconductor region 1NA and the third semiconductor region 1NB may be made of a single semiconductor region. In which case, the avalanche photodiode APD includes a semiconductor region of a first conductivity type (for example, N-type), a semiconductor region of a second conductivity type (for example, P-type) forming a pn junction with the semiconductor region of the first conductivity type, and another semiconductor region of the second conductivity type that is located in the semiconductor region of the second conductivity type and that has a higher impurity concentration than the semiconductor region of the second conductivity type. In this configuration, the semiconductor region of the second conductivity type having the higher impurity concentration is the light receiving region. In the avalanche photodiode APD provided in the semiconductor substrate 50B, for example, the first semiconductor region 2PA, the second semiconductor region 2PB, and the fourth semiconductor region 2PC may be made of a single semiconductor region. In which case, the avalanche photodiode APD includes a semiconductor region of a first conductivity type (for example, P-type), and a semiconductor region of a second conductivity type (for example N-type) that is located in the semiconductor region of the first conductivity type and that forms a pn junction with the semiconductor region of the first conductivity type. In this configuration, the semiconductor region of the second conductivity type is the light receiving region.

In the semiconductor substrate 50A and the semiconductor substrate 50B, each conductivity type of P-type and N-type may be exchanged to be opposite to the above conductivity type. The light receiving region S1 of the semiconductor substrate 50A may be configured to include $N^+$ layer, N layer, P layer, and $P^+$ layer, which are arranged in this order from the principal surface 1Na. The light receiving region S1 of the semiconductor substrate 50B is configured to include $P^+$ layer, N layer, $N^-$ layer, $N^+$ layer, which are arranged in this order from the principal surface 1Na.

In the above-described embodiment and modifications, the grooves 13, 14, and 15 are formed in the semiconductor substrates 50A, 50B, but these grooves 13, 14, and 15 need not be formed.

Although in the above embodiment and modifications, the light receiving regions S1 are described as having hexagonal or octagonal shapes when viewed from the Z-axis direction, it will be appreciated that other shapes may be used. For example, shapes having ten or more sides may be used.

INDUSTRIAL APPLICABILITY

The present invention can be used for a photodetecting device to detect weak light.

REFERENCE SIGNS LIST 1 photodetecting device
13, 14, 15, 23 groove
50A, 50B semiconductor substrate
1Na, 1Nb principal surface
S1 light receiving region
APD avalanche photodiode
TH through-hole
TE through-electrode
G1, G2, G3 length
AR1, AR2 area
L3 insulating layer.

The invention claimed is:
1. A photodetecting device comprising:
a semiconductor substrate including a first principal surface and a second principal surface that oppose each other;
a plurality of avalanche photodiodes each including a light receiving region disposed at the first principal surface side of the semiconductor substrate, the avalanche photodiodes being arranged in a matrix at the semiconductor substrate, and arranged to operate in Geiger mode; and a plurality of through-electrodes electrically connected to corresponding light receiving regions, and penetrating through the semiconductor substrate in a thickness direction, wherein the plurality of through-electrodes are arranged for each area surrounded by four mutually adjacent avalanche photodiodes of the plurality of avalanche photodiodes, each of the light receiving regions has, when viewed from a direction perpendicular to the first principal surface, a polygonal shape including a pair of first sides opposing each other in a row direction and extending in a column direction and four second sides opposing four through-electrodes surrounding the light receiving region and extending in directions intersecting with the row direction and the column direction, and a length of the first side is shorter than a length of the second side.

2. The photodetecting device according to claim 1, wherein the polygonal shape of each of the light receiving regions further includes a pair of third sides opposing each other in the column direction and extending in the row direction, and the length of the third side is shorter than the length of the second side.

3. The photodetecting device according to claim 1, wherein a total length of the four second sides is equal to or more than 50% of an entire circumference of the light receiving region.

4. The photodetecting device according to claim 1, wherein, when viewed from the direction perpendicular to the first principal surface, a groove is formed at the first principal surface side of the semiconductor substrate to surround the light receiving region.

5. The photodetecting device according to claim 4, wherein when viewed from the direction perpendicular to the first principal surface, the groove surrounds an entire circumference of the corresponding light receiving region.

6. The photodetecting device according to claim 4, wherein the groove formed to surround two light receiving regions adjacent to each other in the row direction shares a portion formed between the two light receiving regions adjacent to each other in the row direction.

7. The photodetecting device according to claim 4, wherein the groove formed to surround two light receiving regions adjacent to each other in the column direction shares a portion formed between the two light receiving regions adjacent to each other in the column direction.

8. The photodetecting device according to claim 4, wherein, when viewed from the direction perpendicular to the first principal surface, an area surrounded by the groove has a polygonal shape.

9. The photodetecting device according to claim 1, wherein the through-electrode is arranged in a through-hole penetrating through the semiconductor substrate in the thickness direction, when viewed from the direction perpendicular to the first principal surface, an opening of the through-hole has a circular shape, and an insulating layer is arranged in an inner peripheral surface of the through-hole.

* * * * *